(12) United States Patent
Jeng et al.

(10) Patent No.: US 10,446,520 B2
(45) Date of Patent: Oct. 15, 2019

(54) 3D SEMICONDUCTOR PACKAGE INTERPOSER WITH DIE CAVITY

(71) Applicant: Taiwan Semiconductor Manufacturing Company, Ltd., Hsinchu (TW)

(72) Inventors: Shin-Puu Jeng, Hsinchu (TW); Shang-Yun Hou, Jubei (TW); Kim Hong Chen, Freemont, CA (US); Wensen Hung, Zhubei (TW); Szu-Po Huang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 80 days.

(21) Appl. No.: 15/722,983

(22) Filed: Oct. 2, 2017

(65) Prior Publication Data
US 2018/0026008 A1  Jan. 25, 2018

Related U.S. Application Data

(60) Division of application No. 15/154,770, filed on May 13, 2016, now Pat. No. 9,780,072, which is a
(Continued)

(51) Int. Cl.
*H01L 25/065* (2006.01)
*H01L 23/00* (2006.01)
(Continued)

(52) U.S. Cl.
CPC ...... *H01L 25/0652* (2013.01); *H01L 21/4853* (2013.01); *H01L 21/4857* (2013.01);
(Continued)

(58) Field of Classification Search
None
See application file for complete search history.

(56) References Cited

U.S. PATENT DOCUMENTS

| 4,728,751 A | 3/1988 | Canestaro et al. |
| 4,811,082 A | 3/1989 | Jacobs et al. |

(Continued)

FOREIGN PATENT DOCUMENTS

| JP | 2008103536 A | 5/2008 |
| JP | 4339309 B2 | 10/2009 |

(Continued)

OTHER PUBLICATIONS

Kurita, Y. et al., "SMAFTI Packaging Technology for New Interconnect Hierarchy", IEEE, NEC Electronics Corporation Sagamihara, Kanagawa, 229-1198, Japan, 2009, pp. 220-222.
(Continued)

*Primary Examiner* — Cory W Eskridge
(74) *Attorney, Agent, or Firm* — Slater Matsil, LLP

(57) ABSTRACT

Disclosed herein is a method of forming a device, comprising mounting a plurality of first interconnects on one or more first integrated circuit dies. One or more second integrated circuit dies are mounted on a first side of an interposer. The interposer is mounted at a second side to the first integrated circuit dies, the plurality of first interconnects disposed outside of the interposer. The interposer is mounted to a first side of a substrate by attaching the first interconnects to the substrate, the substrate in signal communication with one or more of the first integrated circuit dies through the first interconnects.

20 Claims, 31 Drawing Sheets

Related U.S. Application Data continuation of application No. 14/249,637, filed on Apr. 10, 2014, now Pat. No. 9,385,095, which is a continuation-in-part of application No. 13/899,815, filed on May 22, 2013, now Pat. No. 8,865,521, which is a division of application No. 12/813,212, filed on Jun. 10, 2010, now Pat. No. 8,519,537.

(60) Provisional application No. 61/308,561, filed on Feb. 26, 2010.

(51) Int. Cl.
| | |
|---|---|
| *H01L 23/13* | (2006.01) |
| *H01L 23/498* | (2006.01) |
| *H01L 25/00* | (2006.01) |
| *H01L 23/31* | (2006.01) |
| *H01L 23/538* | (2006.01) |
| *H01L 21/683* | (2006.01) |
| *H01L 25/18* | (2006.01) |
| *H01L 21/56* | (2006.01) |
| *H01L 21/48* | (2006.01) |
| *H01L 23/367* | (2006.01) |
| *H01L 23/42* | (2006.01) |

(52) U.S. Cl.
CPC .......... *H01L 21/561* (2013.01); *H01L 21/563* (2013.01); *H01L 21/6835* (2013.01); *H01L 23/13* (2013.01); *H01L 23/3128* (2013.01); *H01L 23/3135* (2013.01); *H01L 23/367* (2013.01); *H01L 23/49822* (2013.01); *H01L 23/49827* (2013.01); *H01L 23/49833* (2013.01); *H01L 23/49838* (2013.01); *H01L 23/5389* (2013.01); *H01L 24/11* (2013.01); *H01L 24/14* (2013.01); *H01L 24/17* (2013.01); *H01L 24/81* (2013.01); *H01L 24/97* (2013.01); *H01L 25/18* (2013.01); *H01L 25/50* (2013.01); *H01L 23/3677* (2013.01); *H01L 23/42* (2013.01); *H01L 24/13* (2013.01); *H01L 24/16* (2013.01); *H01L 24/29* (2013.01); *H01L 24/32* (2013.01); *H01L 24/73* (2013.01); *H01L 24/92* (2013.01); *H01L 24/94* (2013.01); *H01L 2221/68327* (2013.01); *H01L 2221/68331* (2013.01); *H01L 2224/0401* (2013.01); *H01L 2224/11* (2013.01); *H01L 2224/11002* (2013.01); *H01L 2224/11003* (2013.01); *H01L 2224/1111* (2013.01); *H01L 2224/1183* (2013.01); *H01L 2224/11334* (2013.01); *H01L 2224/11848* (2013.01); *H01L 2224/131* (2013.01); *H01L 2224/13111* (2013.01); *H01L 2224/13116* (2013.01); *H01L 2224/13139* (2013.01); *H01L 2224/1403* (2013.01); *H01L 2224/14051* (2013.01); *H01L 2224/16145* (2013.01); *H01L 2224/16225* (2013.01); *H01L 2224/16227* (2013.01); *H01L 2224/16237* (2013.01); *H01L 2224/1703* (2013.01); *H01L 2224/2919* (2013.01); *H01L 2224/32225* (2013.01); *H01L 2224/73204* (2013.01); *H01L 2224/73253* (2013.01); *H01L 2224/81* (2013.01); *H01L 2224/81005* (2013.01); *H01L 2224/81191* (2013.01); *H01L 2224/81192* (2013.01); *H01L 2224/81805* (2013.01); *H01L 2224/83* (2013.01); *H01L 2224/92125* (2013.01); *H01L 2224/94* (2013.01); *H01L 2224/97* (2013.01); *H01L 2225/0652* (2013.01); *H01L 2225/06513* (2013.01); *H01L 2225/06517* (2013.01); *H01L 2225/06548* (2013.01); *H01L 2225/06568* (2013.01); *H01L 2225/06572* (2013.01); *H01L 2225/06589* (2013.01); *H01L 2924/01013* (2013.01); *H01L 2924/01022* (2013.01); *H01L 2924/01024* (2013.01); *H01L 2924/01027* (2013.01); *H01L 2924/01028* (2013.01); *H01L 2924/01029* (2013.01); *H01L 2924/0132* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01322* (2013.01); *H01L 2924/04941* (2013.01); *H01L 2924/04953* (2013.01); *H01L 2924/12042* (2013.01); *H01L 2924/14* (2013.01); *H01L 2924/1431* (2013.01); *H01L 2924/1436* (2013.01); *H01L 2924/1437* (2013.01); *H01L 2924/1443* (2013.01); *H01L 2924/157* (2013.01); *H01L 2924/1532* (2013.01); *H01L 2924/15153* (2013.01); *H01L 2924/15159* (2013.01); *H01L 2924/15311* (2013.01); *H01L 2924/15321* (2013.01); *H01L 2924/181* (2013.01); *H01L 2924/18161* (2013.01); *H01L 2924/2075* (2013.01); *H01L 2924/20751* (2013.01); *H01L 2924/20752* (2013.01); *H01L 2924/20753* (2013.01); *H01L 2924/20754* (2013.01); *H01L 2924/20755* (2013.01)

(56) References Cited

U.S. PATENT DOCUMENTS

| | | | |
|---|---|---|---|
| 4,990,462 | A | 2/1991 | Sliwa, Jr. |
| 5,075,253 | A | 12/1991 | Sliwa, Jr. |
| 5,380,681 | A | 1/1995 | Hsu |
| 5,481,133 | A | 1/1996 | Hsu |
| 5,818,404 | A | 10/1998 | Lebby et al. |
| 5,895,978 | A | 4/1999 | Palagonia |
| 6,002,177 | A | 12/1999 | Gaynes et al. |
| 6,025,648 | A | 2/2000 | Takahashi et al. |
| 6,187,678 | B1 | 2/2001 | Gaynes et al. |
| 6,229,216 | B1 | 5/2001 | Ma et al. |
| 6,236,115 | B1 | 5/2001 | Gaynes et al. |
| 6,271,059 | B1 | 8/2001 | Bertin et al. |
| 6,271,469 | B1 | 8/2001 | Ma et al. |
| 6,279,815 | B1 | 8/2001 | Correia et al. |
| 6,355,501 | B1 | 3/2002 | Fung et al. |
| 6,434,016 | B2 | 8/2002 | Zeng et al. |
| 6,448,661 | B1 | 9/2002 | Kim et al. |
| 6,461,895 | B1 | 10/2002 | Liang et al. |
| 6,562,653 | B1 | 5/2003 | Ma et al. |
| 6,570,248 | B1 | 5/2003 | Ahn et al. |
| 6,600,222 | B1 | 7/2003 | Levardo |
| 6,603,072 | B1 | 8/2003 | Foster et al. |
| 6,607,938 | B2 | 8/2003 | Kwon et al. |
| 6,661,085 | B2 | 12/2003 | Kellar et al. |
| 6,762,076 | B2 | 7/2004 | Kim et al. |
| 6,790,748 | B2 | 9/2004 | Kim et al. |
| 6,791,195 | B2 | 9/2004 | Urushima |
| 6,879,041 | B2 | 4/2005 | Yamamoto et al. |
| 6,887,769 | B2 | 5/2005 | Kellar et al. |
| 6,908,565 | B2 | 6/2005 | Kim et al. |
| 6,908,785 | B2 | 6/2005 | Kim |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,975,016 | B2 | 12/2005 | Kellar et al. |
| 7,037,804 | B2 | 5/2006 | Kellar et al. |
| 7,056,807 | B2 | 6/2006 | Kellar et al. |
| 7,087,538 | B2 | 8/2006 | Staines et al. |
| 7,098,542 | B1 | 8/2006 | Hoang et al. |
| 7,151,009 | B2 | 12/2006 | Kim et al. |
| 7,157,787 | B2 | 1/2007 | Kim et al. |
| 7,215,033 | B2 | 5/2007 | Lee et al. |

(56) References Cited

U.S. PATENT DOCUMENTS

| | | | |
|---|---|---|---|
| 7,217,994 B2 | 5/2007 | Zhu et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,443,030 B2 | 10/2008 | Muthukumar et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,632,719 B2 | 12/2009 | Choi et al. |
| 7,659,632 B2 | 2/2010 | Tsao et al. |
| 7,834,450 B2 | 11/2010 | Kang |
| 7,928,582 B2 | 4/2011 | Hutto |
| 8,063,654 B2 | 11/2011 | Rahman et al. |
| 8,164,171 B2 | 8/2012 | Lin et al. |
| 8,284,561 B2 | 10/2012 | Su et al. |
| 8,361,842 B2 | 1/2013 | Yu et al. |
| 8,519,537 B2 | 8/2013 | Jeng et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,796,846 B2 | 8/2014 | Lin et al. |
| 8,803,306 B1 | 8/2014 | Yu et al. |
| 8,803,332 B2 | 8/2014 | Lee et al. |
| 8,809,996 B2 | 8/2014 | Chen et al. |
| 8,829,676 B2 | 9/2014 | Yu et al. |
| 8,865,521 B2 | 10/2014 | Jeng et al. |
| 8,877,554 B2 | 11/2014 | Tsai et al. |
| 8,896,109 B2 | 11/2014 | Pagaila et al. |
| 8,933,551 B2 | 1/2015 | Chang et al. |
| 8,970,023 B2 | 3/2015 | Chou et al. |
| 9,564,416 B2 | 2/2017 | Hou et al. |
| 9,653,442 B2 | 5/2017 | Yu et al. |
| 2002/0003232 A1 | 1/2002 | Ahn et al. |
| 2002/0003297 A1 | 1/2002 | Smola et al. |
| 2002/0081755 A1 | 6/2002 | Degani et al. |
| 2003/0035270 A1 | 2/2003 | Shieh et al. |
| 2004/0056344 A1 | 3/2004 | Ogawa et al. |
| 2004/0245608 A1 | 12/2004 | Huang et al. |
| 2005/0009259 A1 | 1/2005 | Farnworth |
| 2005/0104196 A1 | 5/2005 | Kashiwazaki |
| 2006/0113653 A1 | 6/2006 | Xiaoqi et al. |
| 2006/0145328 A1 | 7/2006 | Hsu |
| 2006/0249828 A1 | 11/2006 | Hong |
| 2007/0196953 A1 | 8/2007 | Fasano et al. |
| 2007/0289127 A1 | 12/2007 | Hurwitz et al. |
| 2007/0290319 A1 | 12/2007 | Kim |
| 2008/0116589 A1 | 5/2008 | Li et al. |
| 2008/0150125 A1 | 6/2008 | Braunisch et al. |
| 2008/0157316 A1 | 7/2008 | Yang |
| 2008/0185713 A1 | 8/2008 | Dani et al. |
| 2008/0185719 A1 | 8/2008 | Cablao et al. |
| 2008/0248610 A1 | 10/2008 | Chew et al. |
| 2008/0265434 A1 | 10/2008 | Kurita |
| 2008/0272477 A1 | 11/2008 | Do et al. |
| 2008/0283992 A1 | 11/2008 | Palaniappan et al. |
| 2008/0315372 A1 | 12/2008 | Kuan et al. |
| 2009/0065927 A1 | 3/2009 | Meyer |
| 2009/0121326 A1 | 5/2009 | Kim et al. |
| 2009/0186446 A1 | 7/2009 | Kwon et al. |
| 2009/0230531 A1 | 9/2009 | Do et al. |
| 2009/0243065 A1 | 10/2009 | Sugino et al. |
| 2009/0309212 A1 | 12/2009 | Shim et al. |
| 2009/0321921 A1 | 12/2009 | Hwang |
| 2010/0019370 A1 | 1/2010 | Pressel et al. |
| 2010/0052135 A1 | 3/2010 | Shim et al. |
| 2010/0102428 A1 | 4/2010 | Lee et al. |
| 2010/0244219 A1 | 9/2010 | Pagaila et al. |
| 2010/0276787 A1 | 11/2010 | Yu et al. |
| 2010/0314749 A1 | 12/2010 | Kurita |
| 2011/0024888 A1 | 2/2011 | Pagaila et al. |
| 2011/0068444 A1* | 3/2011 | Chi ................. H01L 21/6835 |
| | | 257/669 |
| 2011/0193221 A1 | 8/2011 | Hu et al. |
| 2011/0210444 A1 | 9/2011 | Jeng et al. |
| 2011/0241192 A1 | 10/2011 | Ding et al. |
| 2011/0278732 A1 | 11/2011 | Yu et al. |
| 2011/0285005 A1 | 11/2011 | Lin et al. |
| 2011/0291288 A1 | 12/2011 | Wu et al. |
| 2011/0304999 A1 | 12/2011 | Yu et al. |
| 2012/0049352 A1 | 3/2012 | Kang et al. |
| 2012/0286407 A1 | 11/2012 | Choi et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0075903 A1 | 3/2013 | Pagaila et al. |
| 2013/0082364 A1 | 4/2013 | Wang et al. |
| 2013/0093097 A1 | 4/2013 | Yu et al. |
| 2013/0119533 A1 | 5/2013 | Chen et al. |
| 2013/0168848 A1 | 7/2013 | Lin et al. |
| 2013/0182402 A1 | 7/2013 | Chen et al. |
| 2013/0200529 A1 | 8/2013 | Lin et al. |
| 2013/0203215 A1 | 8/2013 | Hung et al. |
| 2013/0214426 A1 | 8/2013 | Zhao et al. |
| 2013/0249532 A1 | 9/2013 | Lin et al. |
| 2013/0252378 A1 | 9/2013 | Jeng et al. |
| 2013/0307140 A1 | 11/2013 | Huang et al. |
| 2014/0091473 A1 | 4/2014 | Len et al. |
| 2014/0131858 A1 | 5/2014 | Pan et al. |
| 2014/0203429 A1 | 7/2014 | Yu et al. |
| 2014/0210101 A1 | 7/2014 | Lin et al. |
| 2014/0217610 A1 | 8/2014 | Jeng et al. |
| 2014/0225222 A1 | 8/2014 | Yu et al. |
| 2014/0252646 A1 | 9/2014 | Hung et al. |
| 2014/0252647 A1 | 9/2014 | Huang et al. |
| 2014/0264930 A1 | 9/2014 | Yu et al. |
| 2014/0353823 A1 | 12/2014 | Park et al. |
| 2015/0235915 A1 | 8/2015 | Liang et al. |
| 2015/0235936 A1 | 8/2015 | Yu et al. |
| 2015/0235989 A1 | 8/2015 | Yu et al. |
| 2015/0235990 A1 | 8/2015 | Cheng et al. |
| 2015/0235993 A1 | 8/2015 | Cheng et al. |
| 2016/0240508 A1 | 8/2016 | Hou et al. |
| 2017/0229432 A1 | 8/2017 | Lin et al. |
| 2017/0338177 A1 | 11/2017 | Lin et al. |
| 2017/0345788 A1 | 11/2017 | Pan et al. |

FOREIGN PATENT DOCUMENTS

| | | |
|---|---|---|
| KR | 20090028687 A | 3/2009 |
| KR | 20090122277 A | 11/2009 |
| KR | 20100119507 A | 11/2010 |
| KR | 20120019091 A | 3/2012 |
| KR | 20130077031 A | 7/2013 |

OTHER PUBLICATIONS

Kurita, Yoichiro et al., "SMAFTI Package Technology Features Wide-Band and Large-Capacity Memory", Innovative Common Technologies to Support State-of-the-Art Products, pp. 52-56.

Motohashi, N. et al., "SMAFTI Package with Planarized Multilayer Interconnects", IEEE, Electronic Components and Technology Conference, 2009, pp. 599-606.

Ranganathan, N. et al., "Integration of High Aspect Ratio Tapered Silicon Via for Through-Silicon Interconnection," 58th Electronic Components and Technology Conference, ECTC 2008., May 2008, pp. 859-865, IEEE, Lake Buena Vista, Florida, United States.

* cited by examiner

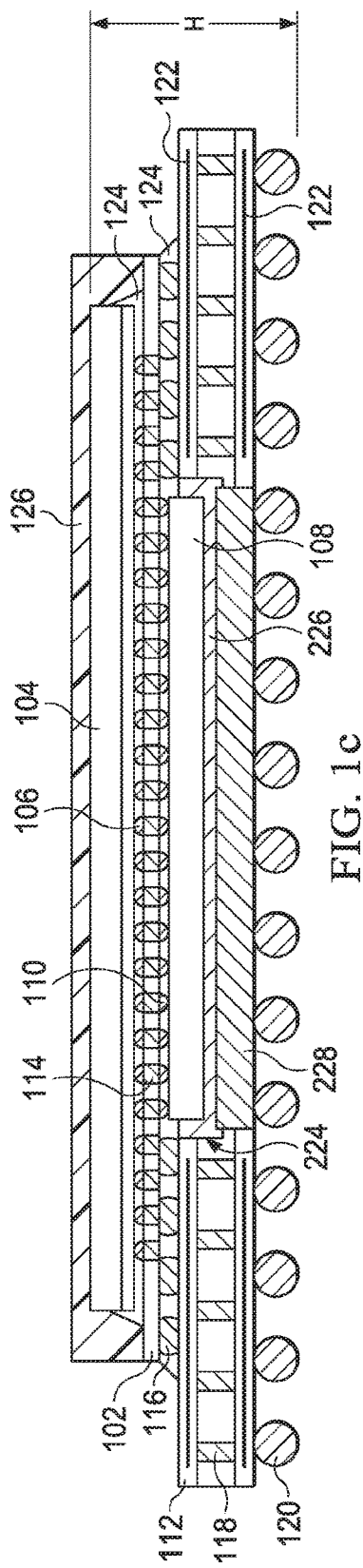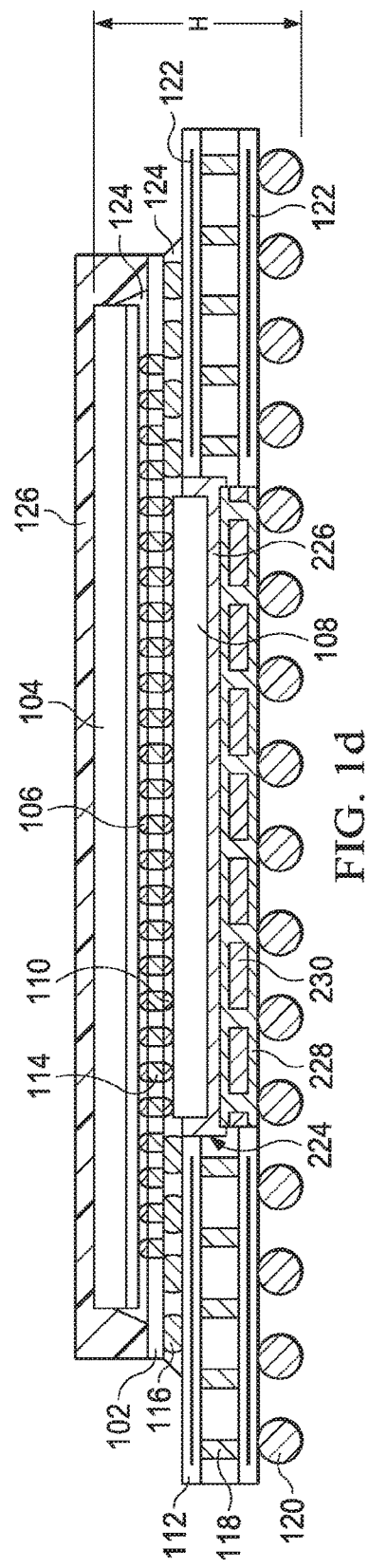

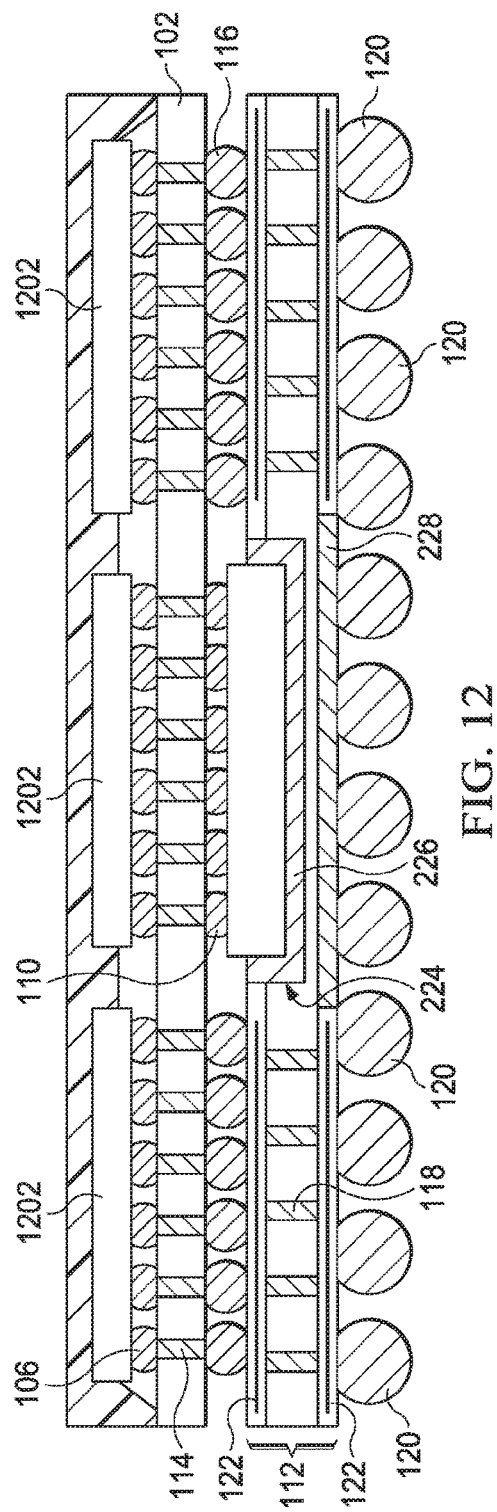
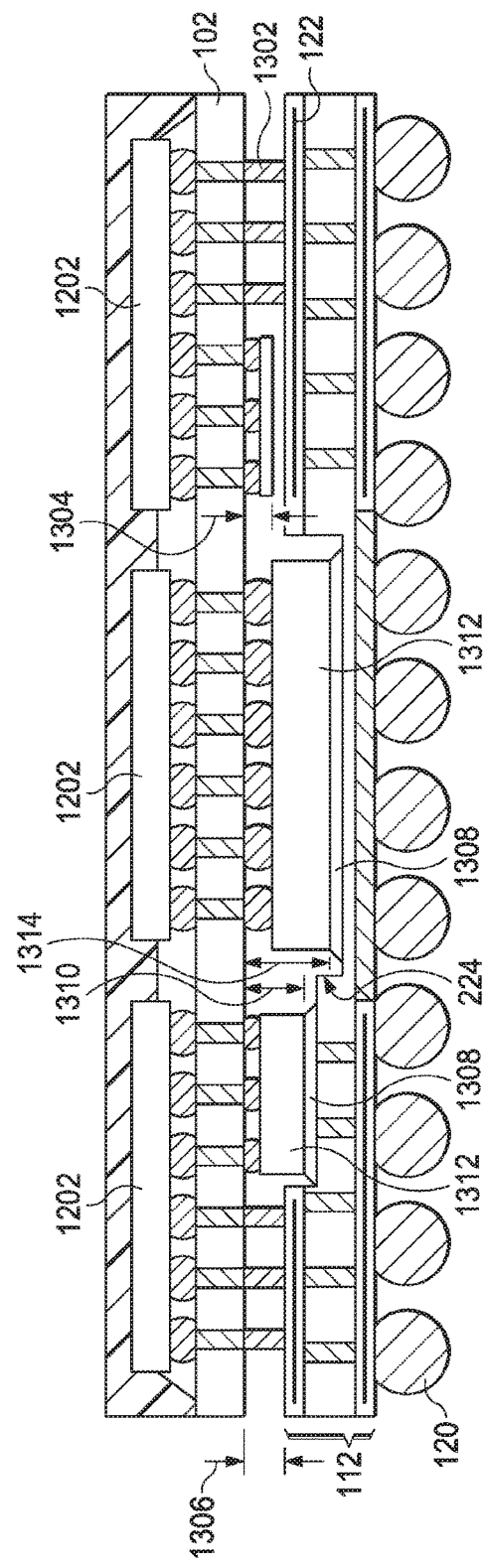

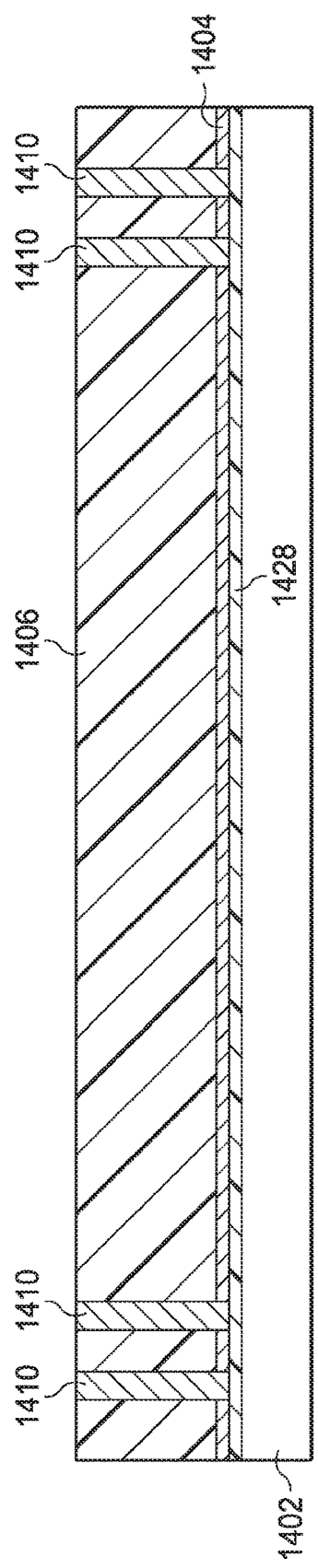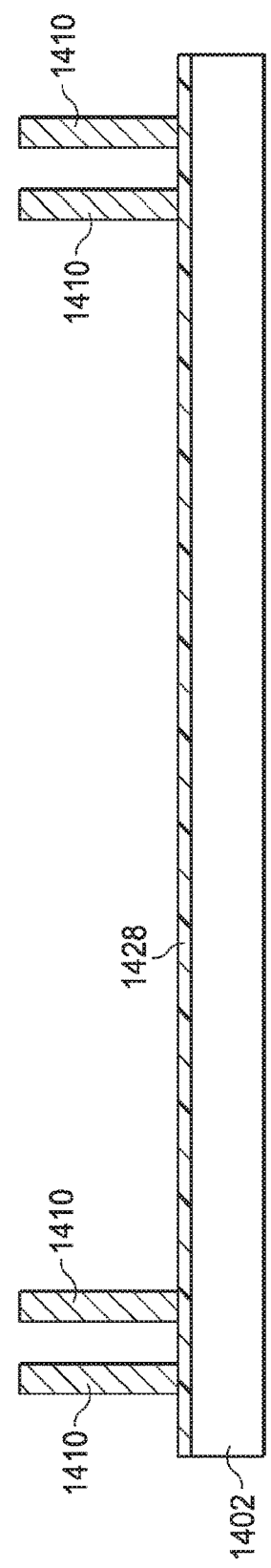

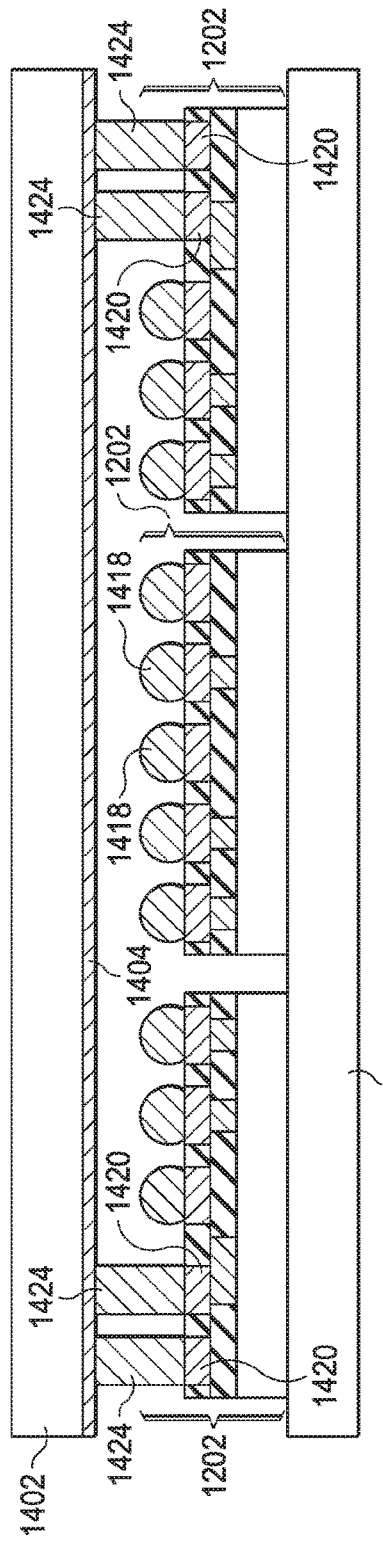
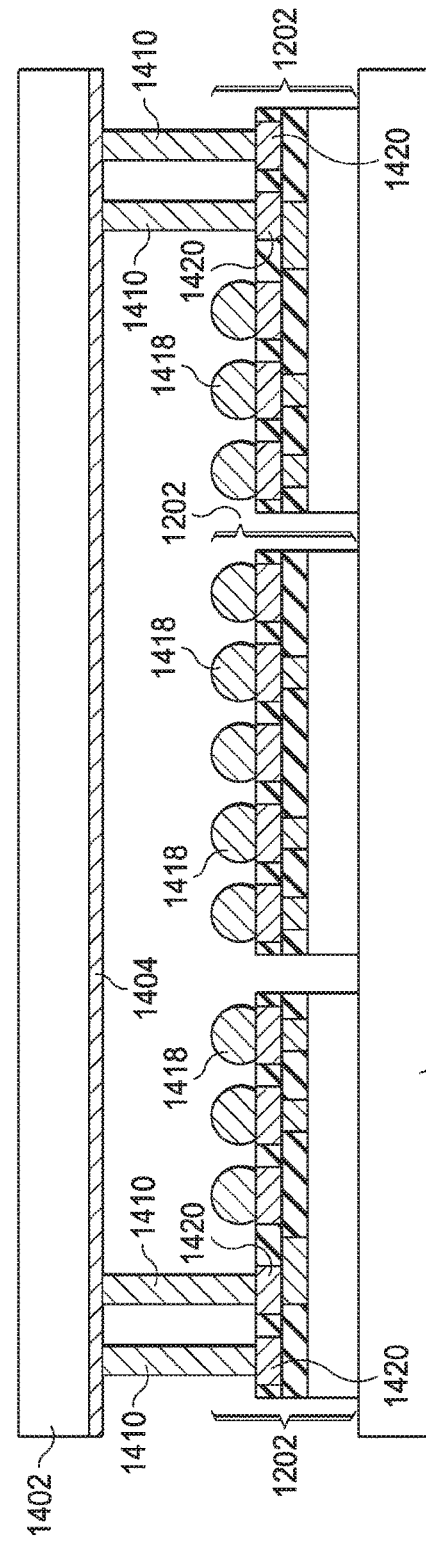
FIG. 15a
FIG. 15b

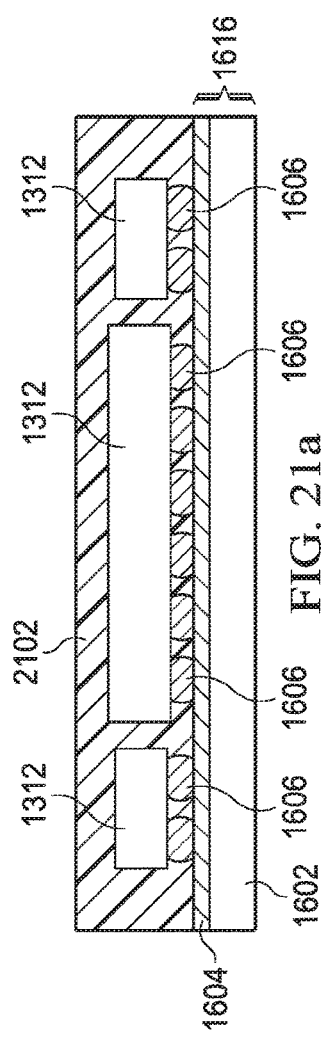
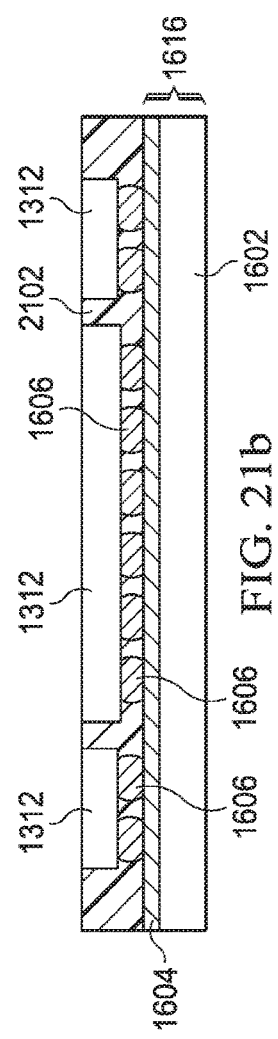
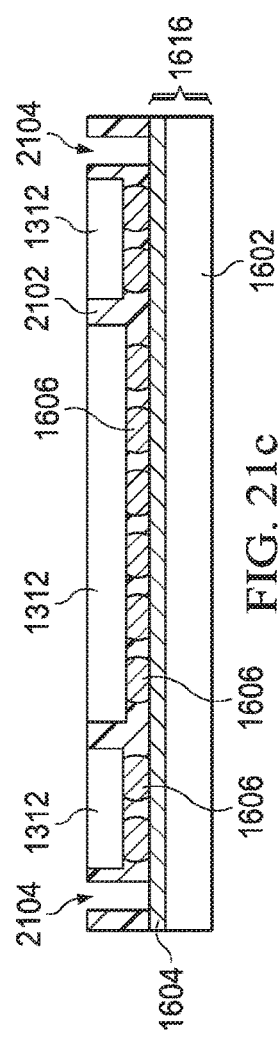

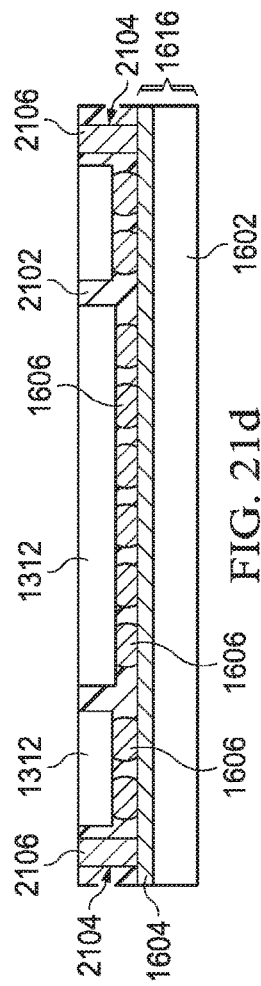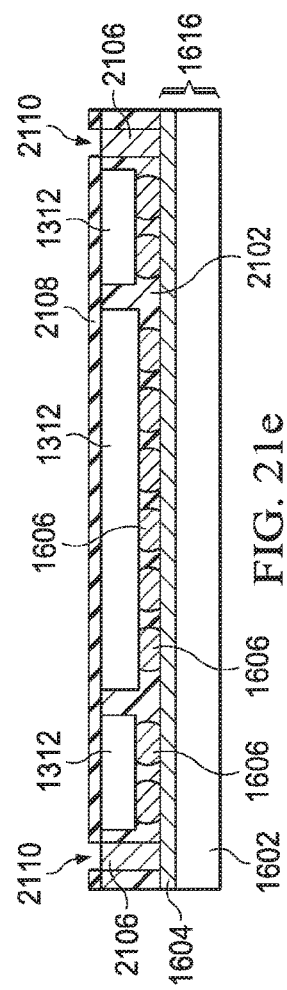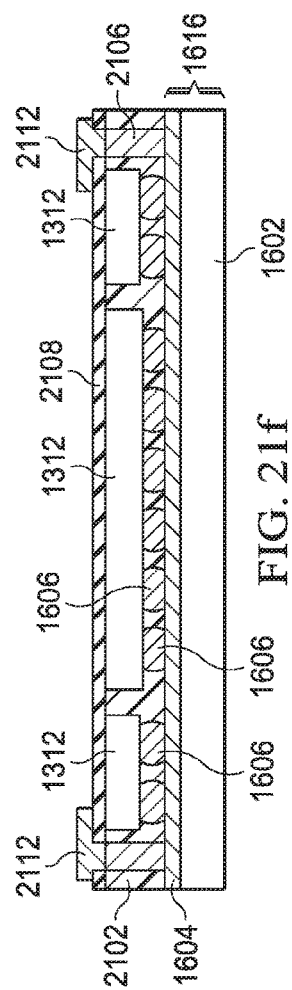

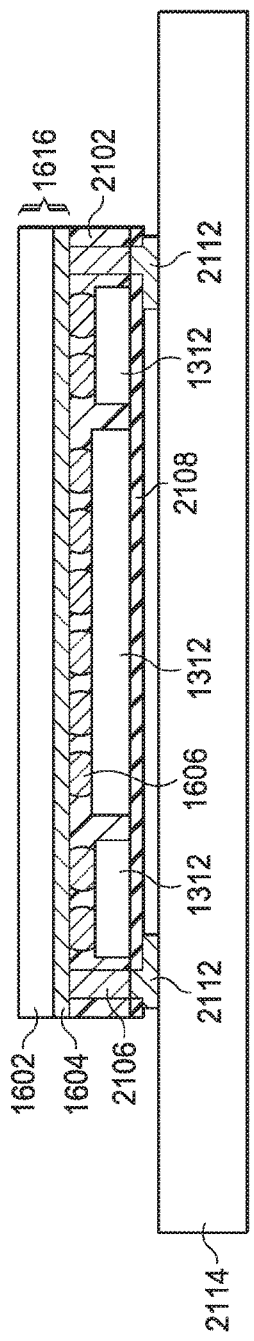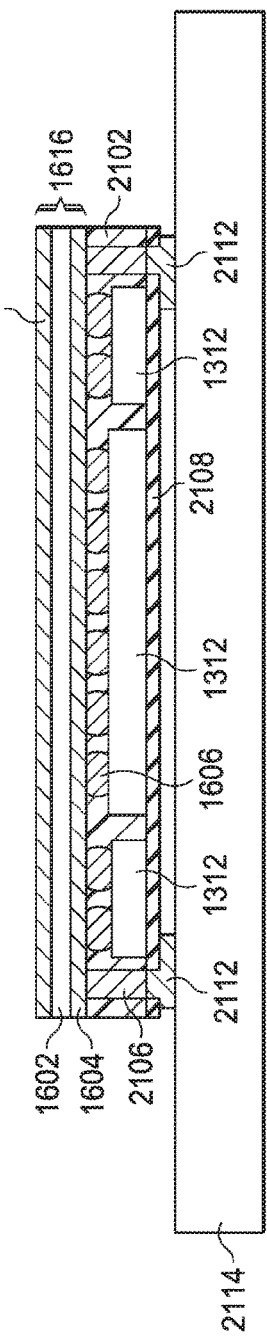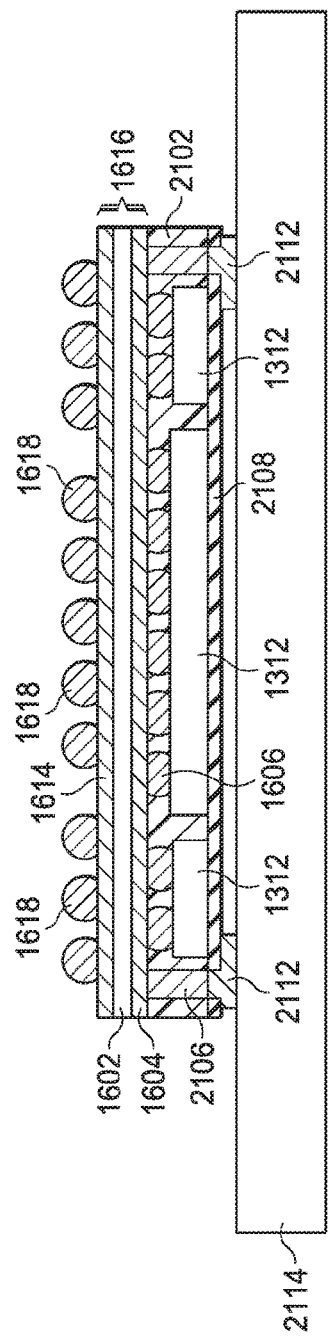

3D SEMICONDUCTOR PACKAGE INTERPOSER WITH DIE CAVITY

PRIORITY CLAIM AND CROSS-REFERENCE

This application is a divisional of U.S. patent application Ser. No. 15/154,770, filed May 13, 2016 and entitled "3D Semiconductor Package Interposer With Die Cavity," which is a continuation of U.S. patent application Ser. No. 14/249,637, filed Apr. 10, 2014, now U.S. Pat. No. 9,385,095 issued on Jul. 5, 2016, and entitled "3D Semiconductor Package Interposer With Die Cavity," which is a continuation-in-part of U.S. patent application Ser. No. 13/899,815, filed May 22, 2013, now U.S. Pat. No. 8,865,521 issued on Oct. 21, 2014, and titled "3D Semiconductor Package Interposer with Die Cavity," which is a divisional of U.S. application Ser. No. 12/813,212 filed on Jun. 10, 2010, now U.S. Pat. No. 8,519,537 issued on Aug. 27, 2013, and titled "3D Semiconductor Package Interposer with Die Cavity," which claims the benefit of U.S. Provisional Application No. 61/308,561, filed Feb. 26, 2010, and titled "3D Semiconductor Device Using An Interposer," all of which applications are hereby incorporated herein by reference.

BACKGROUND

Since the invention of the integrated circuit (IC), the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

Another 3D package utilized packaging-on-packaging (PoP) or interposer techniques for stacking dies to reduce form factor. PoP typically includes one packaged die placed over another packaged die, wherein the dies are electrically coupled by solder bumps. The bottom die is then electrically coupled to a packaging substrate. PoP packages, however, are difficult to decrease the form factor. Additionally, packages utilizing an interposer are limited by the pin count to the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

For a more complete understanding of the embodiments, and the advantages thereof, reference is now made to the following descriptions taken in conjunction with the accompanying drawings, in which:

FIGS. 1a-1d illustrate various features and characteristics of various embodiments;

FIGS. 12 and 13 illustrate features and characteristics of various embodiments;

FIGS. 14a-14h are diagrams illustrating intermediate process steps for forming tall interconnects by masking and plating according to some embodiments;

FIGS. 15a-15b are diagrams illustrating intermediate process steps for forming tall interconnects by stretching according to some embodiments;

FIGS. 21a-21k are diagrams illustrating intermediate process steps for forming an interposer and mounting the first and second integrated circuit dies to the interposer according to some embodiments;

DETAILED DESCRIPTION

This disclosure relates generally to semiconductor devices and, more particularly, to 3D semiconductor packages using an interposer.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Figure 1A:
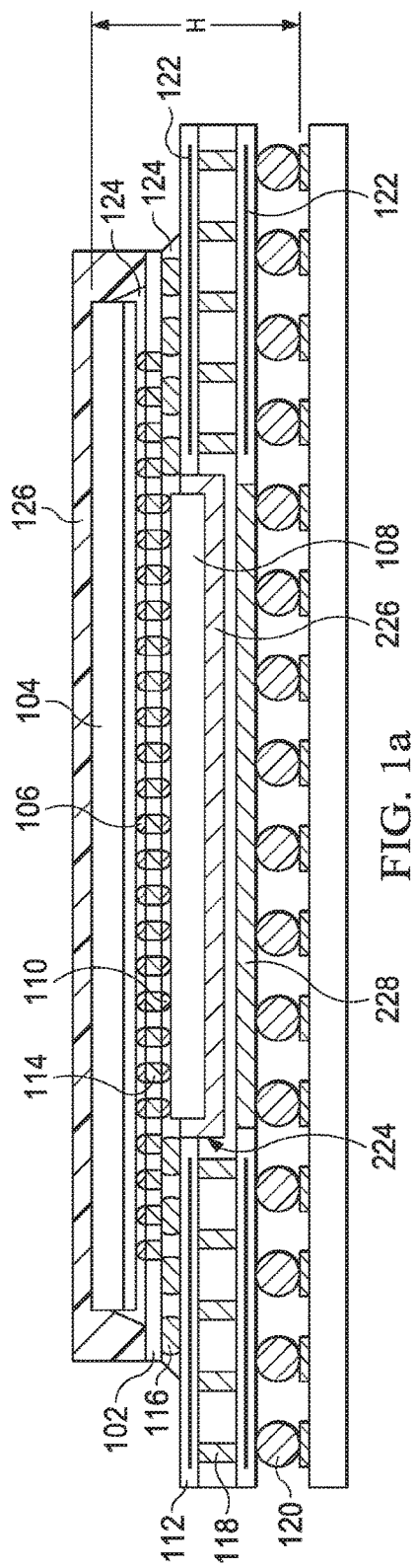

Referring first to FIG. 1a, there is shown a cross-section view of an interposer 102 with a first integrated circuit die 104 attached to a first side of the interposer 102 via a first set of conductive bumps 106 and a second integrated circuit die 108 attached to a second side of the interposer 102 via a second set of conductive bumps 110 in accordance with an embodiment. The first set of conductive bumps 106 and the second set of conductive bumps 110 may comprise, for example, microbumps having a diameter of about 5 microns to about 50 microns.

The interposer 102 is further attached to a substrate 112, which may be, for example, a packaging substrate, another die/wafer, a printed-circuit board, a high-density interconnect, or the like. Through substrate vias (TSVs) 114 in the interposer 102 provide an electrical connection between the first integrated circuit die 104 and the second integrated circuit die 108, as well as between the substrate 112 and one or both of the first integrated circuit die 104 and the second integrated circuit die 108 via a third set of conductive bumps 116. TSVs 118 in the substrate 112 provide an electrical connection between the third set of conductive bumps 116 and a set of conductive balls 120, which may in turn be connected to another substrate (not shown).

The substrate 112 may be any suitable substrate, such as a 1/2/1 laminate substrate, a 4-layer laminate substrate, or the like. Redistribution lines (RDLs), indicated generally by lines 122, within the substrate 112 allow for a different pin configuration as well as a larger conductive ball 120.

The substrate 112 also includes a cavity 224 such that the second integrated circuit die 108 extends into the cavity 224 formed in the underlying substrate 112. As a result of the cavity 224, the size of the third set of conductive bumps may be smaller than what would be possible using a substrate without a cavity, because the size of the third set of conductive bumps no longer needs to be greater than the thickness of the second integrated circuit die 108. It should also be noted that because the size of the third set of conductive bumps may be smaller, it may be possible to increase the pin count available for a same size of interposer 102. As a result, a thinner overall package may be possible.

The first integrated circuit die 104 and the second integrated circuit die 108 may be any suitable integrated circuit die for a particular application. For example, one of the first integrated circuit die 104 and the second integrated circuit die 108 may be a memory chip, such as a DRAM, SRAM, NVRAM, and/or the like, while the other die may be a logic circuit. In an embodiment such as this example, the second integrated circuit die 108 may comprise a DRAM die having a thickness of about 100 μm, the third set of conductive bumps 116 may have a thickness of about such as about 80 μm diameter bumps (about 60 μm collapsed). In contrast, if a substrate is used without a cavity, the third set of conductive bumps 116 may be required to have a larger size, such as about 150 μm, which may collapse to have a thickness of about 120 μm. The larger conductive balls 120 may have a diameter of about 250 μm. Thus, as a result of the cavity 224, the resulting package may have a total height H from the conductive balls 120 to a top surface of the first integrated circuit die 104 of about 0.87 mm, as compared to a total height of about 0.93 mm when using a substrate without a cavity.

The cavity 224 may optionally be filled with a thermal pad or gap filler material 226. The thermal pad 226 may be a conformable material suitable to fill the gap between the second integrated circuit die 108 and the substrate 112. The thermal pad 226 may be a thermally conductive material to conduct heat away from the second integrated circuit die. In an embodiment, the thermal pad 226 is formed of a Therm-A-Gap™ Gels or Interface Materials produced by Chomerics, div. of Parker Hannifin Corp. These materials may, for example, comprise an elastomer with metallic fillers. Other materials, such as a thermal interface material or a polymer may also be used.

Figure 1B:
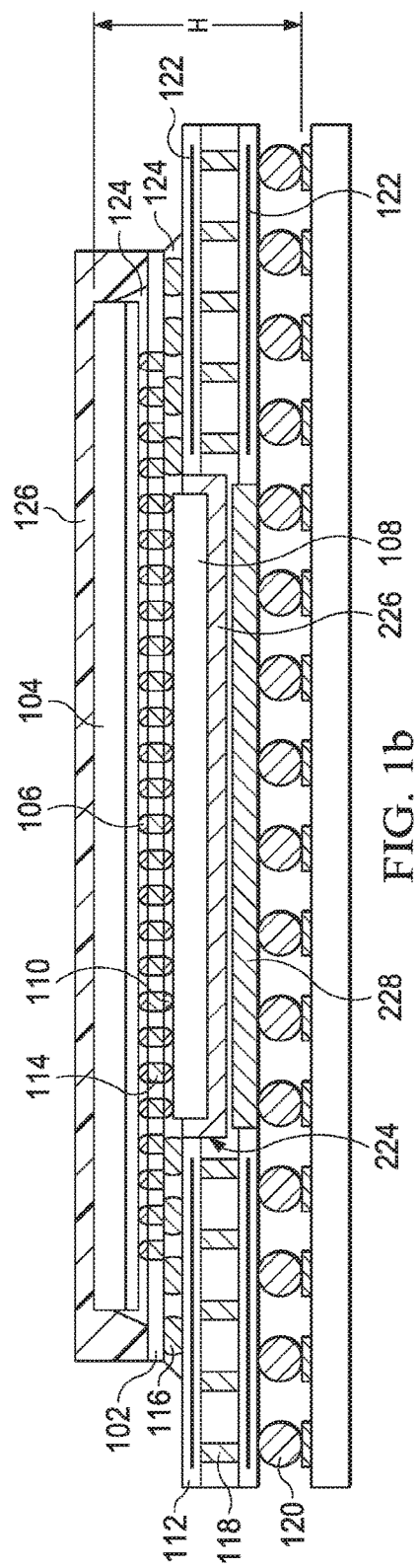

FIG. 1a also illustrates an optional heat conductive pad 228 in the substrate 112. The heat conductive pad 228 may be, for example, a copper pad. The heat conductive pad 228 may have a thickness dependent upon the particular device and the need or desire for additional heat dissipation. For example, FIG. 1a illustrates an embodiment in which the heat conductive pad 228 occupies about 30% of the volume of the substrate below the second integrated circuit die 108. FIGS. 1b and 1c illustrate embodiments in which the heat conductive pad 228 occupies a greater amount, such as 60% and 100%, respectively. It should be noted that depending upon the size of the heat conductive pad 228, the RDL 122 along the bottom side of the substrate 112 may not extend under the second integrated circuit die 108. For example, compare the embodiment illustrated in FIG. 1a, in which the RDL 122 extends between the cavity 224 and a bottom of the substrate 112, to FIG. 1c, in which the RDL 122 is omitted between the cavity 224 and a bottom of the substrate 112 due to the size of the heat conductive pad 228.

In yet another embodiment, thermal vias 230 may be used as illustrated in FIG. 1d. In some embodiments, thermal vias 230 such as those illustrated in FIG. 1d may exhibit performance characteristics similar to a 100% heat conductive pad, but with less heat conductive material (e.g., copper) content and, as a result, may be more cost effective.

FIGS. 1a-1d also illustrate an underfill material 124 placed between the various components, e.g., the first integrated circuit die 104, the second integrated circuit die 108, the interposer 102, and the substrate 112. An encapsulant or overmold 126 may also be formed over the components to protect the components from the environment and external contaminants.

FIGS. 2-9 illustrate a method of forming a semiconductor device such as those illustrated above with reference to FIGS. 1a-1d. It should be noted that the method illustrated in FIGS. 2-9 illustrates a method in which a first die is connected to a first side of an interposer first, followed by forming conductive bumps on a second side of the interposer, placing a second die on the second side of the interposer, and finally, attaching the interposer to a substrate having a cavity formed therein. It should be appreciated that this order is provided for illustrative purposes only, and that other sequences may be used. It should also be noted that the embodiment discussed below assumes that the multiple dies are placed on each side of the interposer, and then the interposer is singulated for placement on a substrate. Other processes, including singulating the interposer prior to placing the first die and/or the second die on the interposer, may be used.

Figure 2:
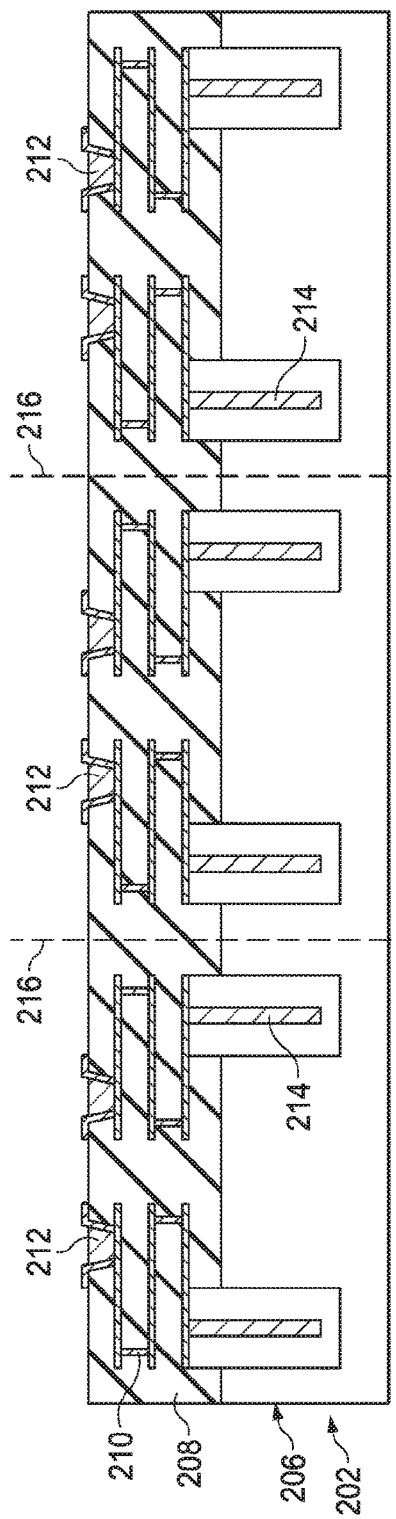
FIGS. 2-9 illustrate various intermediate steps of forming an embodiment.

Referring first to FIG. 2, an interposer 202 is shown in accordance with an embodiment. In an embodiment, the interposer 202 comprises a substrate 206, one or more dielectric layers 208, interconnections 210, contact pads 212, and through substrate vias 214. In general, the substrate 206 is similar to the doped silicon substrate used to form an integrated circuit die. While the substrate 206 may be formed of other materials, it is believed that using silicon substrates for the interposer may reduce the stress because the coefficient of thermal expansion (CTE) mismatch between the silicon substrates and the silicon typically used for the dies is lower than with substrates formed of different materials.

The dielectric layers 208 can be an oxide dielectric or other dielectric materials in which the interconnections 210 may be formed from a conductive material such as aluminum and copper. The interconnections 210 may include, for example, multiple layers of redistribution lines and vias interconnecting adjacent layers of redistribution lines. The interconnections may be formed, for example, of copper, nickel, aluminum, tungsten, titanium, combinations thereof, and/or the like.

The through substrate vias 214, when completed in subsequent processing steps, provide electrically conductive pathways between the contact pads 212 on a first side of the interposer 202 and a second side of the interposer 202, via the interconnections 210. The through substrate vias 214 may be formed by any appropriate method. For example, openings may be formed extending into the substrate 206 by, for example, one or more etching processes, milling, laser techniques, or the like. The openings may be lined with diffusion barrier layers, adhesion layers, isolation layers, and/or the like, and filled with a conductive material. The diffusion barrier layers, for example, may comprise one or more layers of TaN, Ta, TiN, Ti, CoW, or the like, and the conductive material may comprise, for example, copper, tungsten, aluminum, silver, combinations thereof, and/or the like, formed by an electro-chemical plating process, thereby forming the through substrate vias 214.

It should be noted that the interposer 202 illustrates an interposer prior to dicing to form separate packages. In FIG. 2, lines 216 illustrate boundaries, e.g., scribe lines, at which the interposer 202 may be diced upon completion. It should also be noted that two contact pads 212 and two through substrate vias 214 for each package are shown for illustrative purposes only, and that actual devices may have more or less contact pads 212 and through substrate vias 214.

Figure 3:
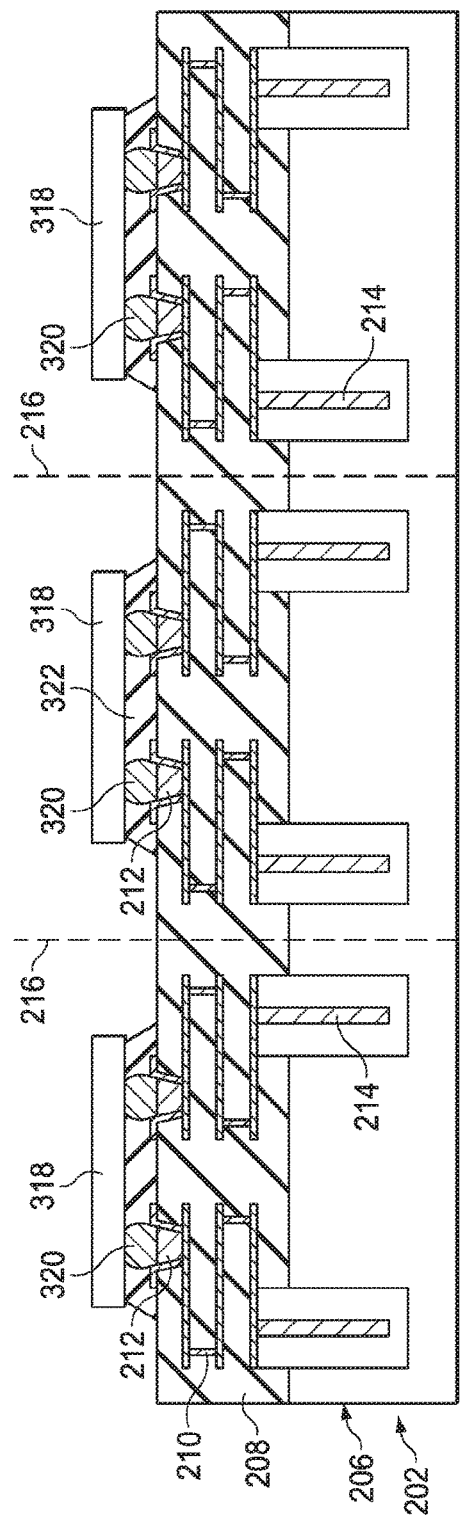

FIG. 3 illustrates placement of first dies 318 onto the interposer 202 in accordance with an embodiment. The first dies 318 may include any suitable circuitry for a particular application. In an embodiment, the first dies 318 are electrically coupled to the interposer 202 in a flip-chip configuration such that contact pads on the first dies 318 face the interposer 202. The contact pads of the first dies 318 are electrically coupled to the contact pads on the interposer 202 via conductive bumps 320, which may be formed by lead free solder, eutectic lead, or the like.

An optional underfill material 322 may be injected or otherwise formed in the space between the first dies 318 and the interposer 202. The underfill material 322 may, for example, comprise a liquid epoxy, deformable gel, silicon rubber, or the like, that is dispensed between the first dies 318 and the interposer 202, and then cured to harden. This underfill material 322 is used, among other things, to reduce cracking in the conductive bumps 320 and to protect the joints from contaminants.

Figure 4:
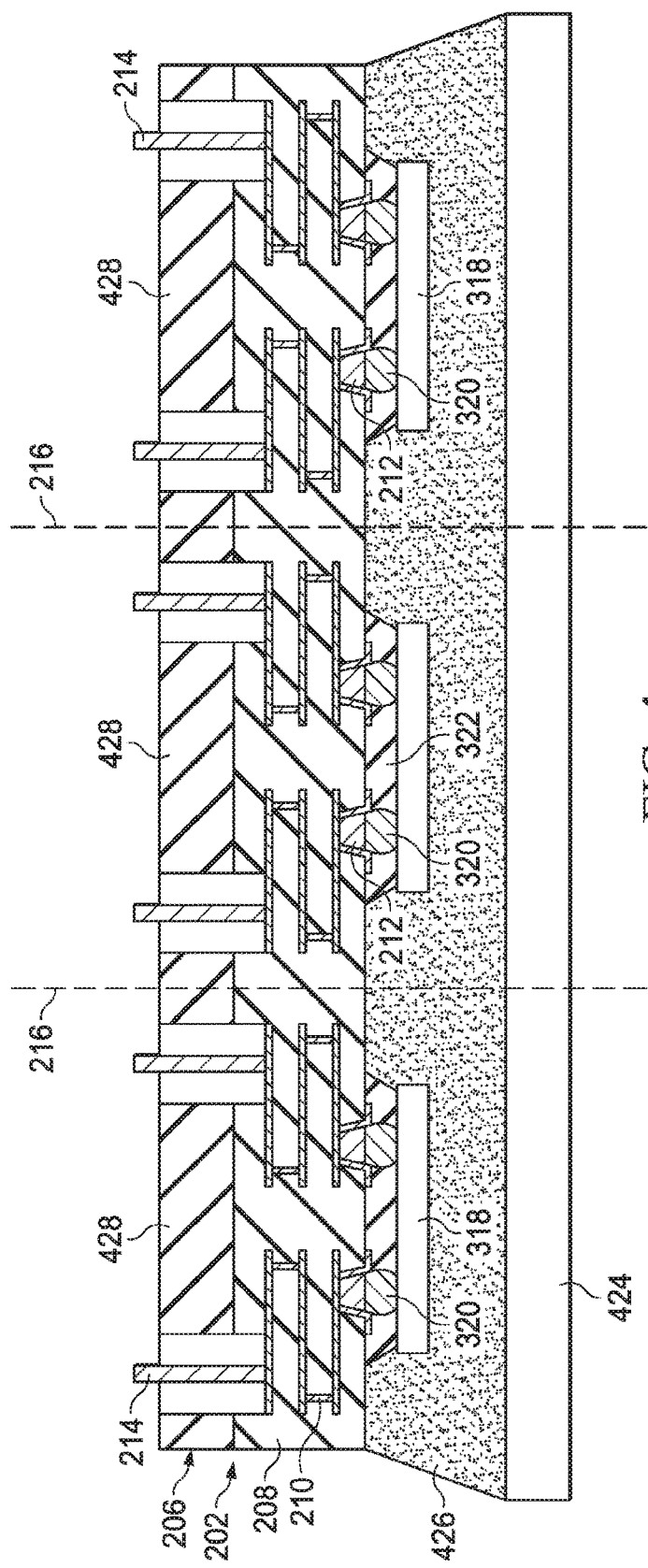

FIG. 4 illustrates attaching a carrier substrate 424 and thinning a backside of the interposer 202 in accordance with an embodiment. The carrier substrate 424 may be attached using an adhesive 426. Generally, the carrier substrate 424 provides temporary mechanical and structural support during subsequent processing steps. In this manner, damage to the interposer 202 is reduced or prevented. The carrier substrate 424 may comprise, for example, glass, silicon oxide, aluminum oxide, and the like. The adhesive 426 may be any suitable adhesive, such as an ultraviolet (UV) glue, which loses its adhesive property when exposed to UV lights.

After attaching the carrier substrate 424 to the interposer 202, a thinning process performed on a backside of the interposer 202 exposes the through substrate vias 214. The thinning process may be performed using an etching process and/or a planarization process, such as a chemical mechanical polishing (CMP) process. For example, initially a planarizing process, such as a CMP, may be performed to initially expose the liner of the through substrate vias 214. Thereafter, one or more wet etching processes having a high etch-rate selectivity between the material of the liner and the interposer 202 may be performed, thereby leaving the through substrate vias 214 protruding from the backside of the interposer 202 as illustrated in FIG. 4. In embodiments in which the interposer 202 comprises silicon, the etch process may be, for example, a dry etch process using $HBr/O_2$, $HBr/Cl_2/O_2$, $SF_6/CL_2$, $SF_6$ plasma, or the like.

After recessing the backside of the interposer 202, a protective layer 428, such as a spin-on glass (SOG) layer is formed. Thereafter, one or more etching steps may be performed to recess the protective layer 428 and to remove the liner, if present. The etching processes may have a high etch-rate selectivity between the material of the protective layer 428/liner and the material of the through substrate vias 214. It should be noted; however, that in other embodiments, the through substrate vias 214 may not protrude from the backside of the interposer 202; any suitable configuration of through substrate vias 214 and the associated interconnects may be used.

Figure 5:
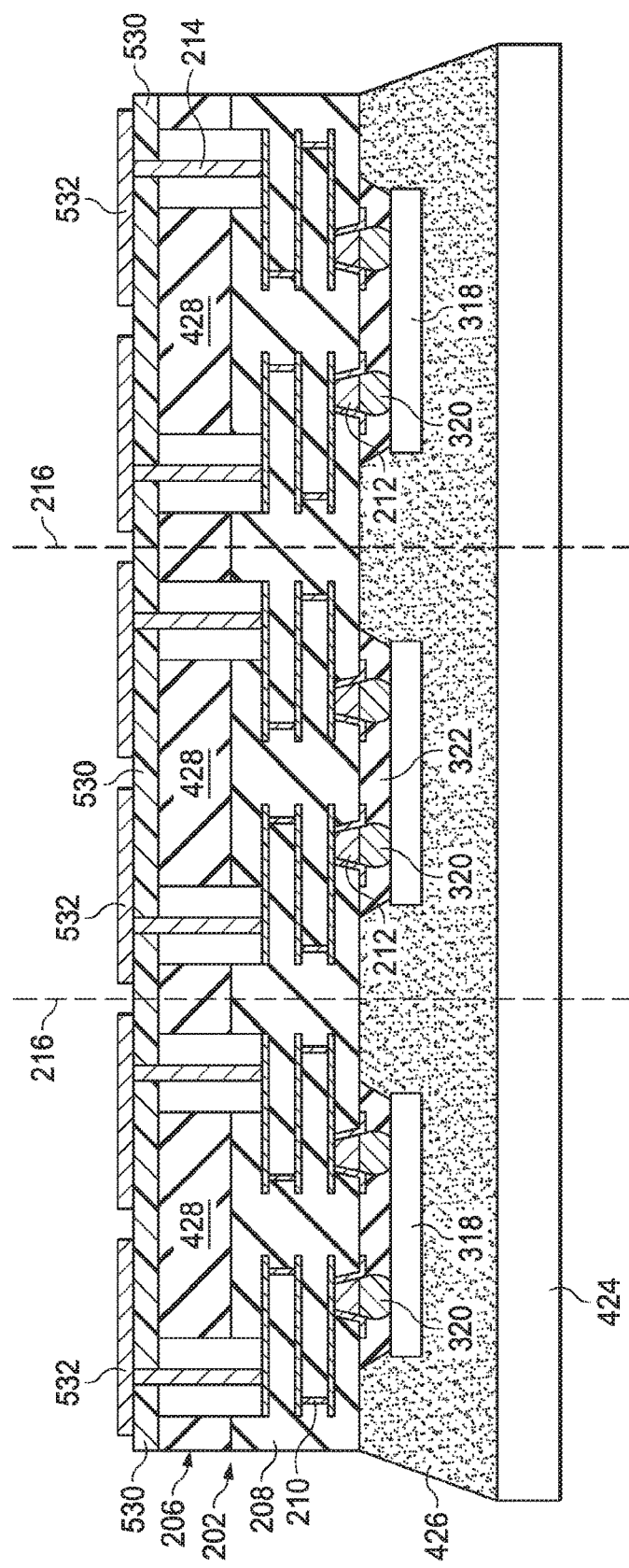

FIG. 5 illustrates formation of a stress buffer layer 530 and a backside RDL 532 in accordance with an embodiment. The stress buffer layer 530 may be formed, for example, of a solder resist material or low-temperature polyimide deposited and etched back to expose the through substrate vias 214. Thereafter the backside RDL 532 may be formed. The backside RDL 532 may be formed of any suitable conductive material, such as copper, copper alloys, aluminum, silver, gold, combinations thereof, and/or the like, formed by any suitable technique, such as electro-chemical plating (ECP), electroless plating, other deposition methods such as sputtering, printing, and chemical vapor deposition (CVD) methods, or the like. A mask (not shown) may also be used.

Figure 6:
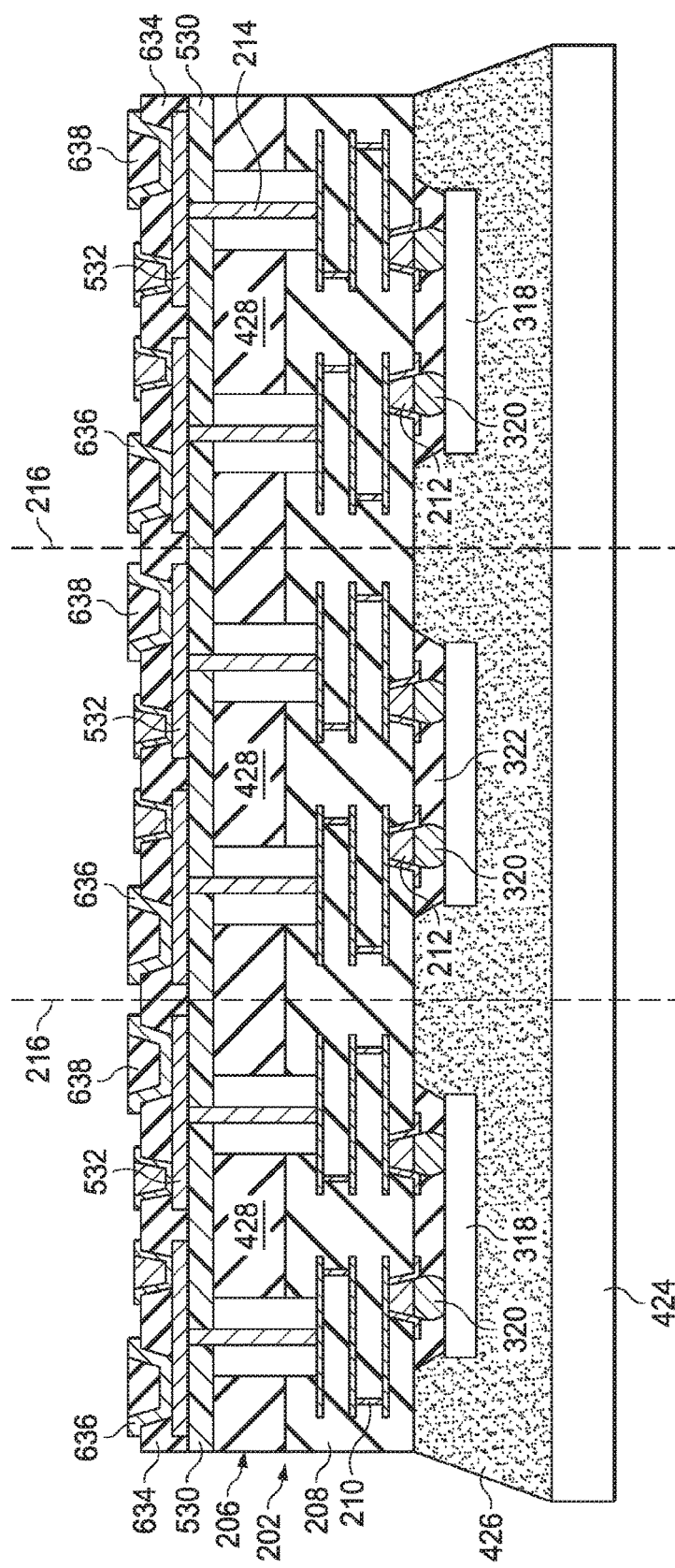

Next, as shown in FIG. 6, a passivation layer 634 is blanket formed and patterned to form openings, in which an under bump metallization (UBM) structure 636 and a presolder 638 are formed. The passivation layer 634 may be formed of nitrides, oxides, polyimide, and the like. The openings in the passivation layer 634 may be formed using photo-lithography techniques such that the openings expose portions of the backside RDL 532. The UBM structures 636 are formed of one or more layers of conductive materials and provide an electrical connection between the backside RDL 532 and the solder bumps to be formed in subsequent processing steps. The UBM structures 636 may be formed, for example, of one or more layers of chrome, a chrome-copper alloy, copper, gold, titanium, titanium tungsten, nickel, combinations thereof, or the like. Once completed, the presolder may be applied to the UBM structures 636.

Figure 7:
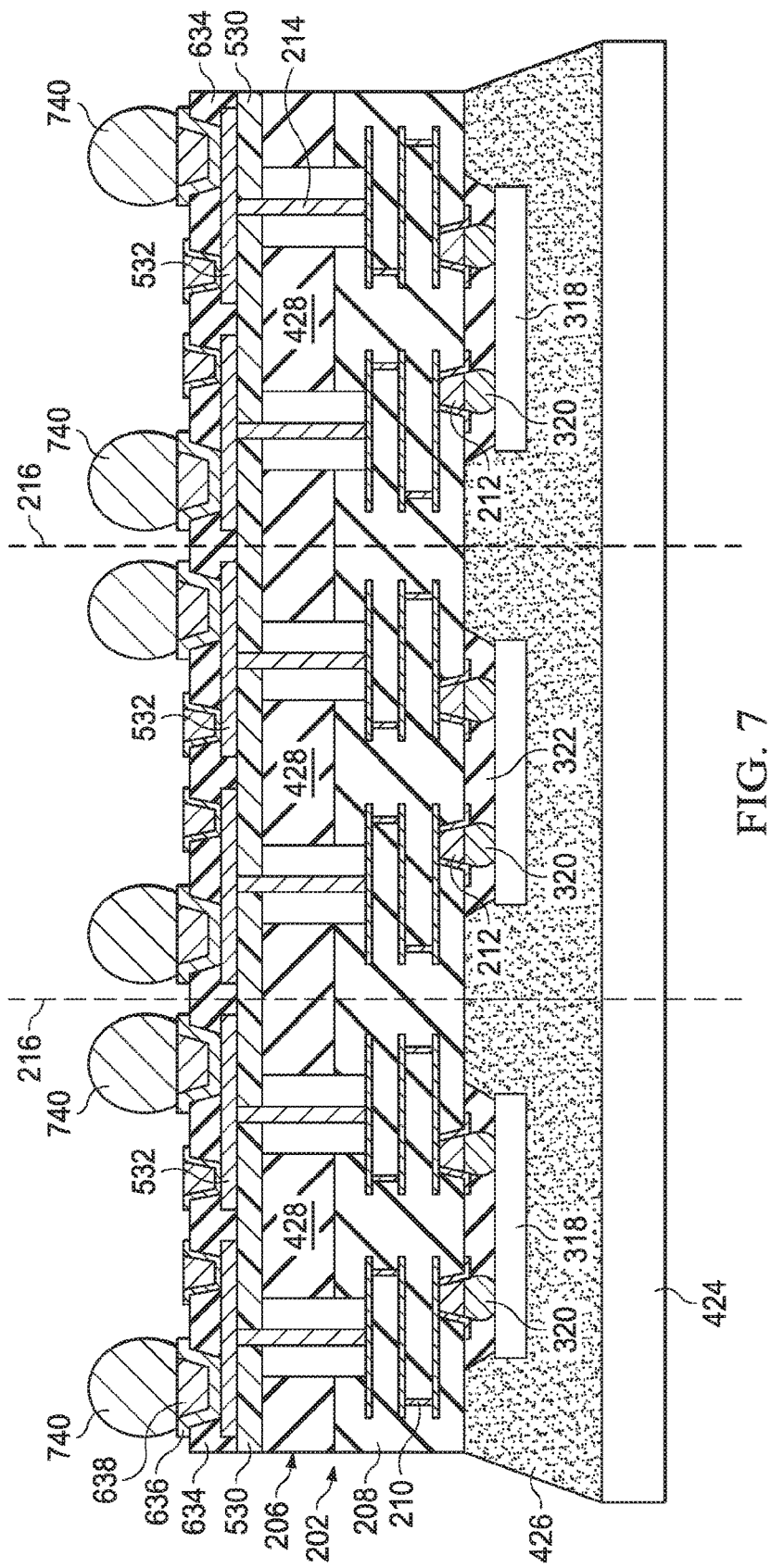

FIG. 7 illustrates conductive bumps 740 placed on select ones of the UBM structures 636 in accordance with an embodiment. The conductive bumps 740 may be formed of a eutectic solder, lead free solder, or the like. As will be discussed in greater detail below, dies will be attached to the UBM structures 636 to which the conductive bumps 740 have not been placed. In order to allow room for the dies, the conductive bumps 740 may be slightly larger than if a die were not attached on both sides of the interposer 202, although as discussed above, the use of a cavity in the underlying substrate may reduce or eliminate the need for a larger bump size. The size of the UBM structures 636 coupled to the conductive bumps 740 may be larger to accommodate the larger size of the conductive bumps 740 as compared to those used to attach dies in subsequent processing steps.

Figure 8:
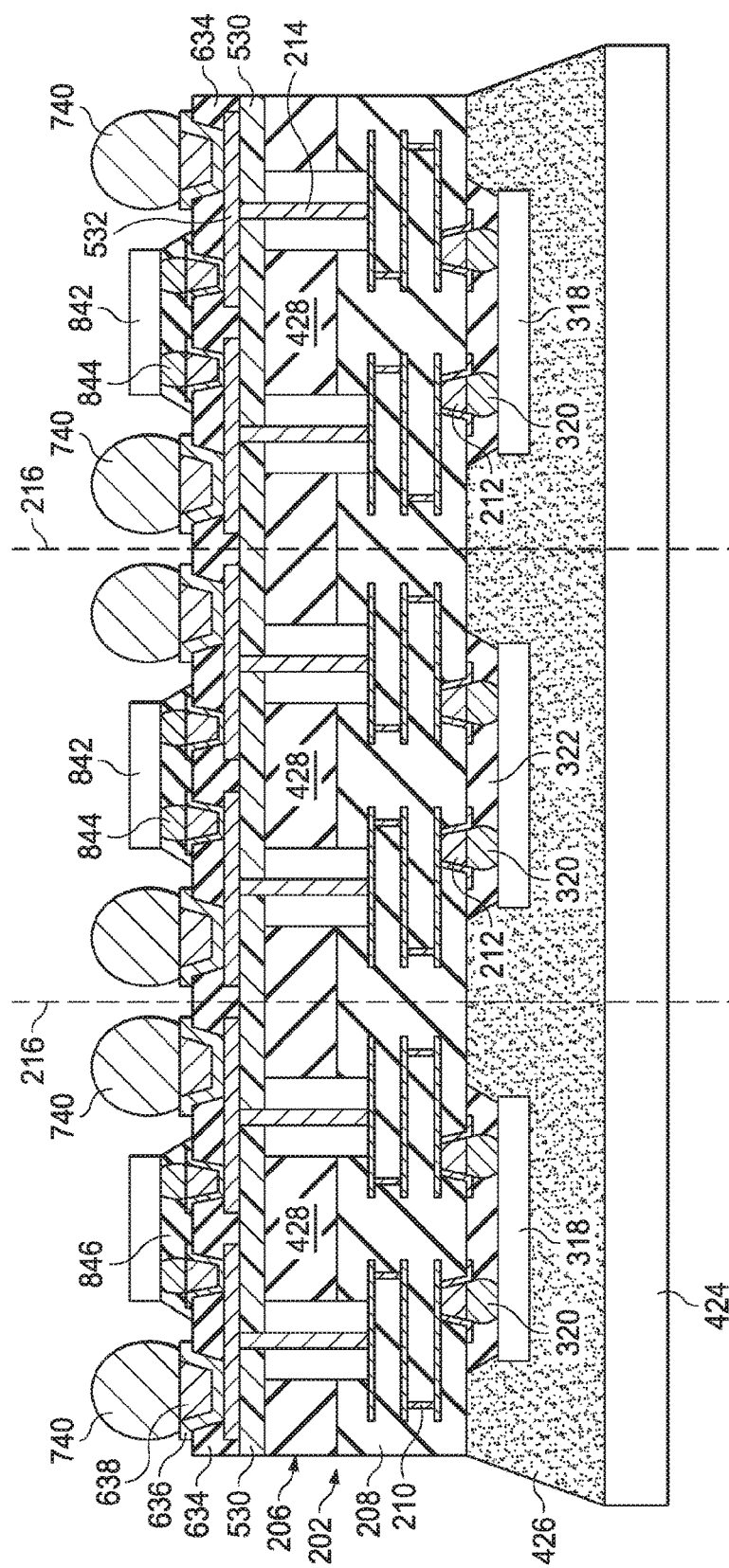

FIG. 8 illustrates placement of second dies 842 among the conductive bumps 740 in accordance with an embodiment. The second dies 842 may include any suitable circuitry for a particular application. In an embodiment, second dies 842 are electrically coupled to the interposer 202 in a flip-chip configuration such that contact pads on the second dies 842 face the interposer 202. The contact pads of the second dies 842 are electrically coupled to the contact pads on the interposer via conductive bumps 844, which may be formed by lead free solder, eutectic lead, or the like.

An optional underfill material 846 may be injected or otherwise formed in the space between second dies 842 and the interposer 202, similar to the underfill material 322 used between the first dies 318 and the interposer 202, to reduce cracking in the conductive bumps 740 and to protect the joints from contaminants. The underfill material 846 may, for example, comprise a liquid epoxy, deformable gel, silicon rubber, or the like, that is dispensed between second dies 842 and the interposer 202, and then cured to harden.

Figure 9:
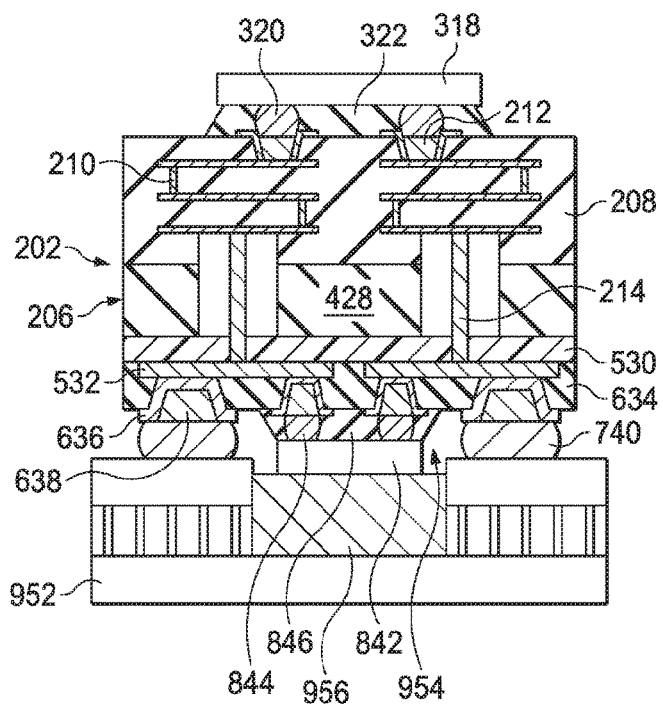

FIG. 9 illustrates the structure illustrated in FIG. 8 after the interposer 202 has been diced and attached to a substrate 952 having a cavity 954 formed therein, such as the substrate discussed above with reference to FIGS. 1*a*-1*d*. In this embodiment, the second die 842 is positioned such that the second die 842 extends into the cavity 954. As discussed above, the use of a substrate having a cavity allows for smaller conductive bumps 740 to be used, and hence, a smaller overall package size.

FIG. 9 also illustrates an optional heat dissipation layer 956, which helps dissipate heat away from the second die 842. The heat dissipation layer 956 may, for example, comprise the thermal pad 226, the heat conductive pad 228, and/or the thermal vias 230. The substrate 952 may be formed by any suitable methods.

It has been found that embodiments such as those discussed above may reduce the stress between the dies and the substrate. It is believed that the reduction is due in part to the CTE mismatch being close to zero between the first die 318, the second die 842, and the interposer 202, particularly when a silicon interposer is being used. This type of configuration tends to thermally isolate the first die 318 and the second die 842 from the substrate 952. Furthermore, the connection between the substrate 952 and the interposer 202 is via conductive bumps 740, which are generally larger. Due to the large size, the stress is dispersed over a greater area, thereby creating a stronger joint.

Figure 10:
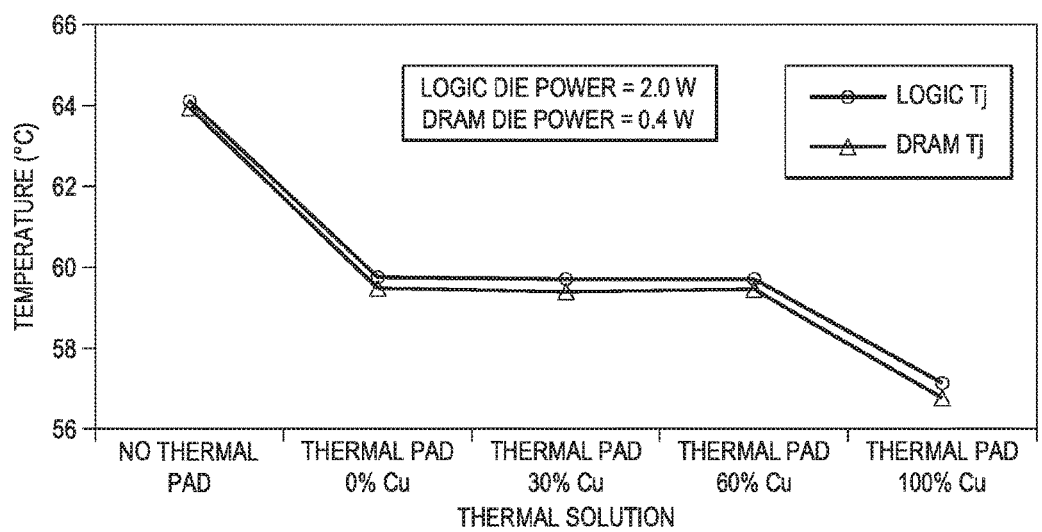
FIG. 10 is a plot representing thermal characteristics that may be obtained with various embodiments.

It has also been found that embodiments such as those discussed above may reduce the operating temperature of the semiconductor device, particularly when both the thermal pad and thermal heat sink are used. For example, FIG. 10 illustrates results that may be obtained by embodiments such as those discussed herein. As illustrated in FIG. 10, the operating temperature of a structure wherein the first die is a logic die operating at 2.0 W and the second die is a DRAM die operating at 0.4 W may be reduced from 64° C. to less than about 58° C. It should be appreciated that since the operating temperature is reduced, power consumption is also reduced.

Figure 11A:
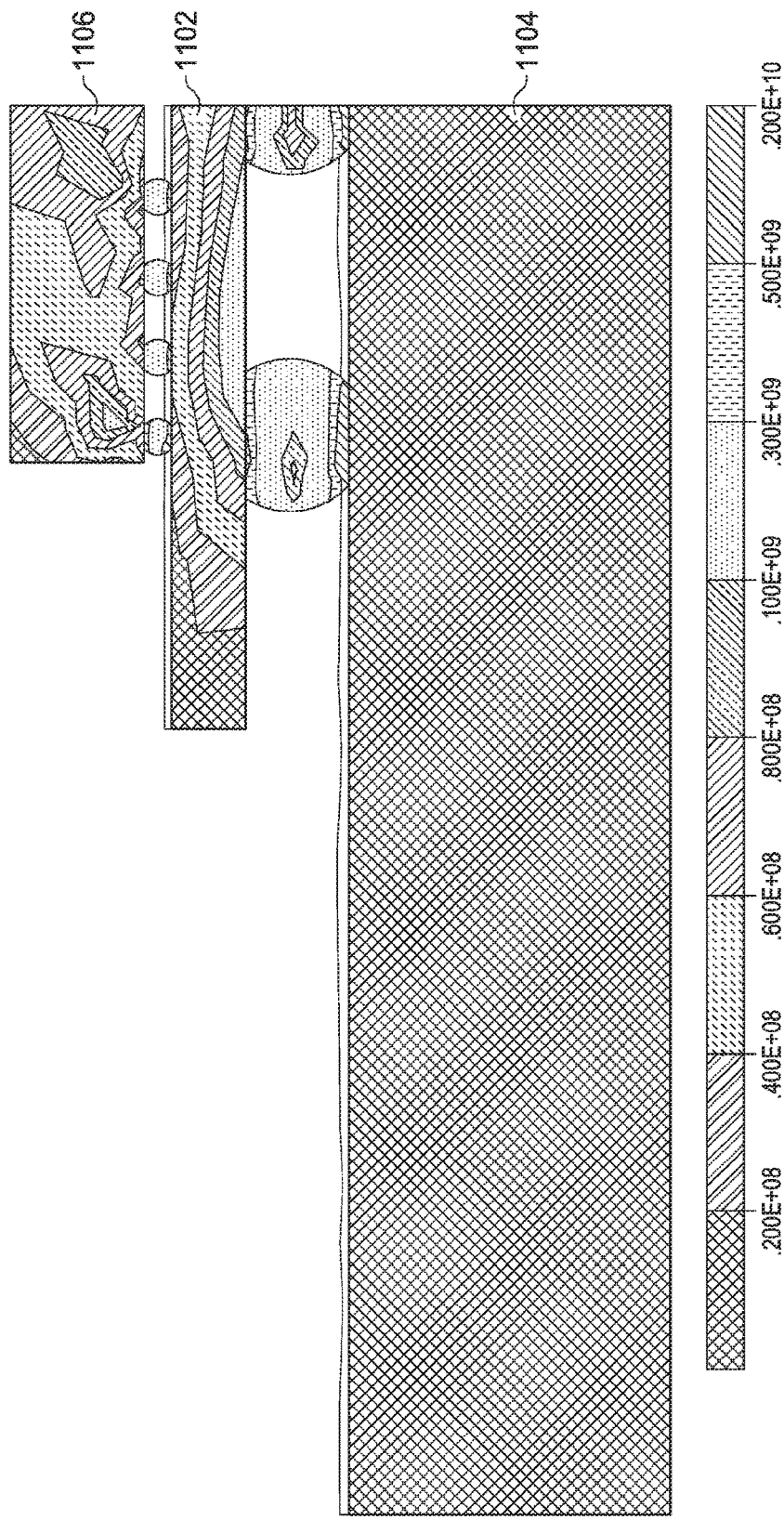
FIGS. 11a and 11b compare stress characteristics of stacked die configurations with and without an interposer.
Figure 11B:
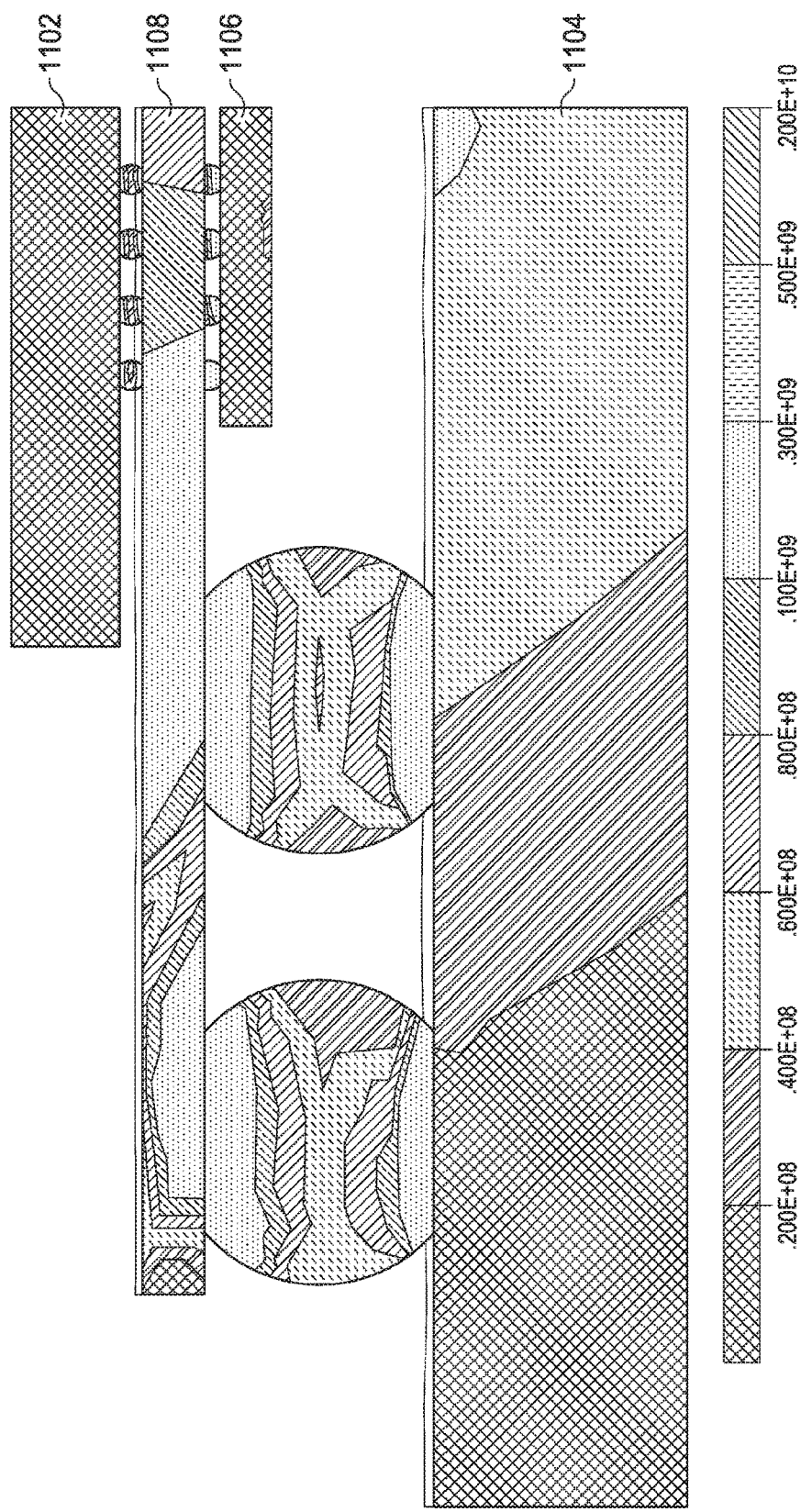

FIGS. 11*a* and 11*b* illustrate a comparison between a stacked die configuration with and without an interposer, wherein the simulation scenario used a thermal cycle between 221° C. and 25° C., micro-bumps of about 20μ, and lead-free (e.g., SnAg) solder. In particular, FIG. 11*a* illustrates stress that may be seen in a configuration in which a first die 1102 is attached to a substrate 1104, e.g., a 1/2/1 laminate substrate, and a second die 1106 is placed directly on the first die 1102. As can be seen, a significant amount of stress may be seen in the connection between the first die 1102 and the second die 1106. A significant amount of stress may also be seen in the connection between the substrate 1104 and the first die 1102.

In comparison, FIG. 11*b* illustrates the stress that may be seen in an embodiment such as that discussed above with reference to FIG. 1. In this case the first die 1102 and the second die 1106 are connected to opposing sides of an interposer 1108. As a result of this type of configuration, the maximum amount of stress in the example illustrated in FIG. 11*a* may be reduced to about 0.845 a.u. compared to a maximum stress of about 2.5 a.u., about a 66% reduction in the maximum stress level. It is believed that this reduction is due in part to the CTE mismatch being close to zero between the first die 1102, the second die 1106, and the interposer 1108, particularly when a silicon interposer is being used. This type of configuration tends to thermally isolate the first die 1102 and the second die 1106 from the substrate 1104.

While these results do not utilize a cavity as discussed above with reference to FIGS. 1*a*-1*d*, it is expected that the use of a substrate with a cavity will have similar stress characteristics, but with a smaller overall package size.

FIG. 12 is a diagram illustrating an interposer 102 with a plurality of first integrated circuit dies 1202 disposed thereon. In such an embodiment, the first integrated circuit die 104 shown in FIGS. 1*a*-1*d* comprises a plurality of first integrated circuit dies 1202. The plurality of integrated circuit dies 1202 are attached to a first side of the interposer 102 via a first set of conductive bumps 106 and the second integrated circuit die 108 attached to a second side of the interposer 102 via a second set of conductive bumps 110. While each of the plurality of first integrated circuit dies 1202 are illustrated here as having roughly a same size or height, the plurality of integrated circuit dies 1202 in the embodiments are not limited to such size relationships. In some embodiments, each of the plurality of first integrated circuit dies 1202 may have a different die body thickness, a different pitch for the attached conductive bumps 106, different widths, different functions or circuitry, or be made by different process methods.

FIG. 13 is a cross-sectional view illustrating an interposer 102 with a plurality of first integrated circuit dies 1202 and a plurality of second integrated circuit dies 1312 disposed thereon. In such an embodiment, one or more of the plurality of second integrated circuit dies 1312 has a different height and/or size. For example, in the embodiment depicted in FIG. 13, the center die of the plurality of second integrated circuit dies 1312 has a first height 1314, while the other dies have a second height 1310 and a third height 1304 that that are different from each other and shorter than the first height 1314. Additionally, one or more of the heights 1310, 1314, 1304 of the plurality of second integrated circuit dies 1312 is greater than the separation of between the substrate 112 and the interposer 102. In such an embodiment, the cavity 224 has multiple regions with different depths. For example, as shown in FIG. 13, the center die is in a first region of the cavity 224, where the first region of the cavity has a first depth to accommodate the center second integrated circuit die 1312 with the first height 1314. The second region of the cavity 224 has a second depth to accommodate the second integrated circuit die 1312 with the second height 1310. Additionally, one or more of the heights 1310, 1314, 1304 of the plurality of second integrated circuit dies 1312 is less than the separation distance 1306 between the substrate 112 and the interposer 102. For example, the rightmost second integrated circuit die 1312 in FIG. 13 has a third height 1304 that is less than the separation distance 1306 between the substrate 112 and the interposer 102. In such an example, the second integrated circuit die 1312 is disposed on the interposer 102 outside of the cavity 224 and between the bottom most surface of the interposer 102 and the topmost surface of the substrate 112. Thus, in some embodiments, one or more of the second integrated circuit dies 1312 extend into the cavity 224, and one or more of the second integrated circuit dies 1312 are disposed outside of the cavity 224 between the interposer 102 and the substrate 112.

Additionally, in some embodiments, the interposer 102 and the substrate 112 are connected by one or more interconnects 1302. The interconnects 1302 are formed from a conductive material such as copper, solder, aluminum, nickel, titanium, tungsten, gold, an alloy or another conductive material. The interconnects 1302 are formed, in some embodiments, by masking and plating, by stretching a reflowed material, by placing a solid stud, by forming a wirebond stud or another technique.

The interconnects 1302 are sized to permit a finer pitch, or smaller separation between the interconnects 1302 at a predetermined height, than a solder ball or bump. This is due to the higher aspect ratio, or height-to-width ratio, of the interconnects 1302, which is due to the interconnects 1302 being self-supporting. This is in contrast to a solder ball that relies on surface tension to give the solder ball height. The surface tension of a solder ball limits the achievable aspect ratio due to the viscosity of the solder when melted.

In some embodiments, one or more of the plurality of first integrated circuit dies 1202 extend past the edge of the interposer 102, with the overhanding portions of the first integrated circuit dies 1202 connected directly to the substrate 112 by way of tall interconnects outside the edges of the interposer. FIGS. 14a-14h and 15a-15b are diagrams illustrating intermediate process steps for forming tall interconnects according to various embodiments.

Figure 14A:
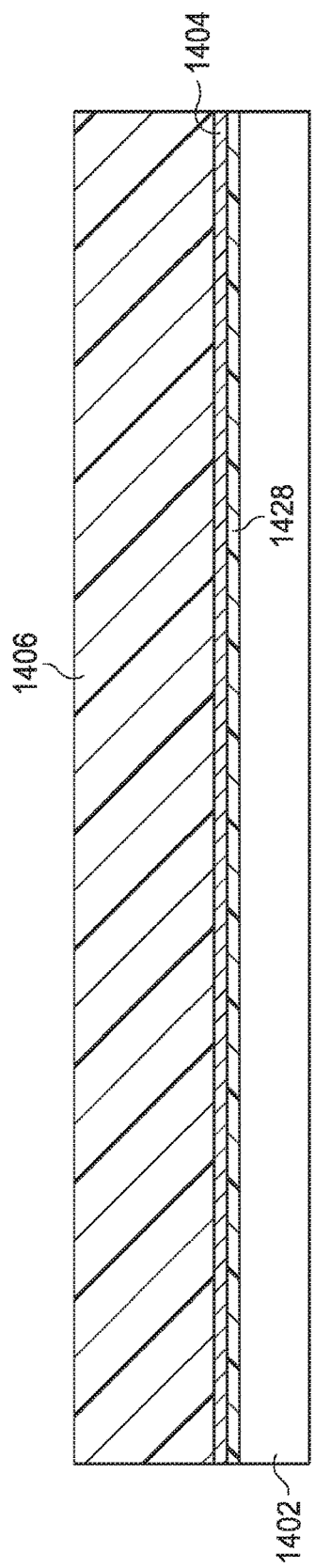

FIGS. 14a-14h are diagrams illustrating intermediate process steps for forming tall interconnects by masking and plating according to some embodiments. Referring initially to FIG. 14a, mask layer 1406 is formed on a carrier 1402 according to an embodiment. A carrier 1402, such as a glass or other rigid substrate, is provided and a release layer 1428 is formed on the carrier 1402. A seed layer 1404 is deposited on the carrier 1402, though, for example, CVD, sputtering or another deposition process. In an embodiment, the seed layer 1404 is, for example, titanium, copper, or another metal. A mask layer 1406 is formed over the seed layer 1404. The mask layer 1406 is, in some embodiments, a dry film layer applied from a tape, reel, sheet or other film. In other embodiments, the mask layer 1406 is a hard mask, such as a nitride, oxide or the like, or is a resist such as a photoresist with a polymeric based material. In some embodiments, a dry film resist comprises a polymeric material, photo-reactive material, filler and adhesion promoters. In such embodiments, the dry film is applied using a lamination process and with laminator equipment, promoting mechanical adhesion of the dry film resist to the carrier. The laminator equipment controls the temperature, pressure and speed of the lamination process to produce the optimum quality of film layer.

Figure 14B:
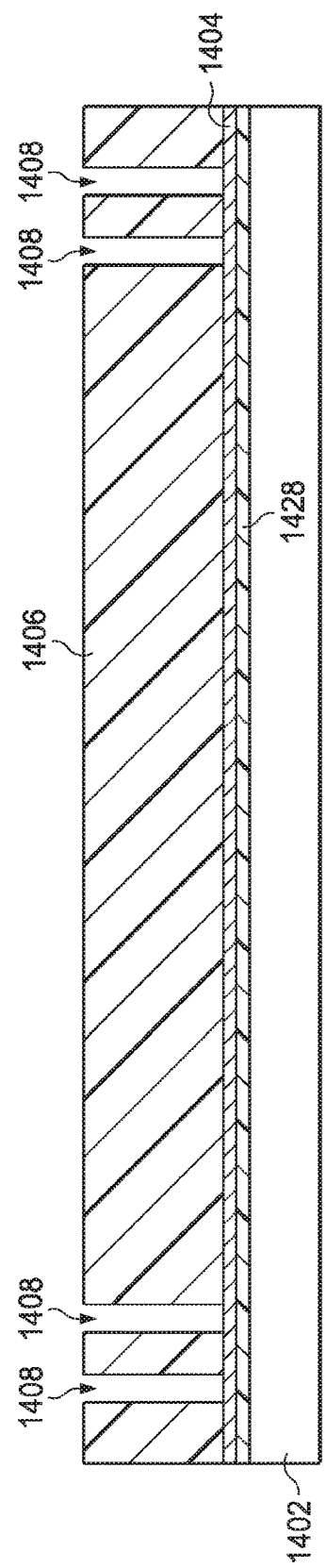

FIG. 14b is a diagram illustrating patterning the mask layer 1406 according to an embodiment. The patterned mask layer 1406 has one or more openings 1408 formed therein and extending through the mask layer 1406 to the seed layer 1404. In some embodiments, the openings are formed using a laser, through masking and etching, photolithography, or another patterning method. In another embodiment, the mask layer 1406 is patterned prior to application.

FIG. 14c is a diagram illustrating forming tall interconnects 1410 in the mask layer 1406 according to an embodiment. A metal layer is formed in openings 1408 in the mask layer 1406 to form the interconnects 1410. In an embodiment, the interconnects 1410 are formed by electroplating, ECP, electroless plating, CVD, or another metal deposition process. The interconnects 1410 are formed from, for example, copper, aluminum, gold, solder, titanium, an alloy, or another conductive material. In some embodiments, the interconnects 1410 are formed to a height of 100 μm or greater.

FIG. 14d is a diagram illustrating forming disencapsulation of the interconnects 1410 according to an embodiment. The mask layer 1406 is removed to leave the interconnects on the release layer 1428. For example, where the mask layer 1406 is a dry film, the mask layer 1406 is peeled off. In some embodiments, the mask layer 1406 is chemically removed by etching or with a solvent, or by ashing. The seed layer 1404 may also be removed, though, for example, an anisotropic etch.

Figure 14E:
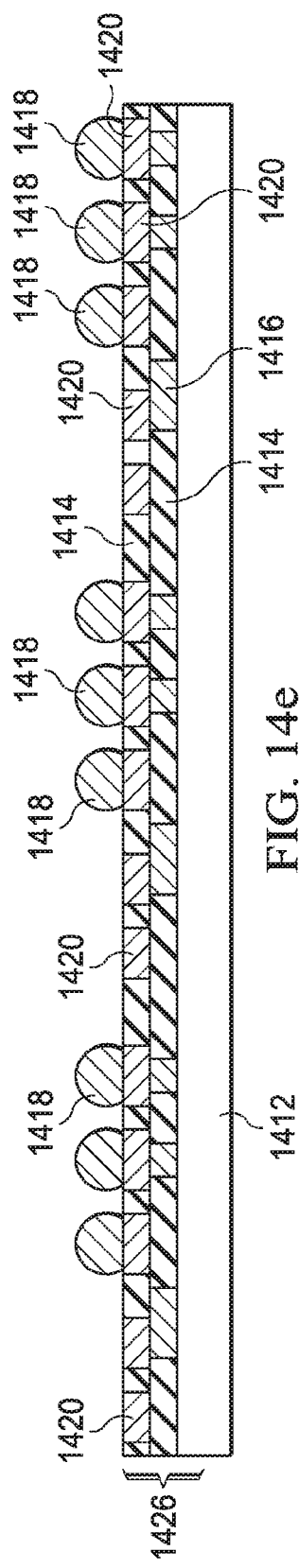

FIG. 14e is a diagram illustrating preparation of a first integrated circuit die wafer according to some embodiments. One or more integrated circuits with semiconductor devices (omitted for clarity) are disposed in a substrate 1412 and an RDL 1426 or metal layer stack is disposed over the substrate 1412. The RDL 1426 is formed as part of a first integrated circuit die back-end-of-line (BEOL) process. One or more metal lines 1416 are disposed in one or more dielectric layer 1414 over the substrate to provide connectivity between the devices on the substrate 1412 and other devices, packages, or the like. Additionally, one or more conductive bumps 1418 are formed on lands 1420 exposed at the surface of the wafer.

It should be understood that FIG. 14e illustrates a wafer having a single type of integrated circuit die. However, the illustrated embodiment is not meant to be limiting, as the plurality of first integrated circuit dies 1202 may comprise different types of dies.

Figure 14F:
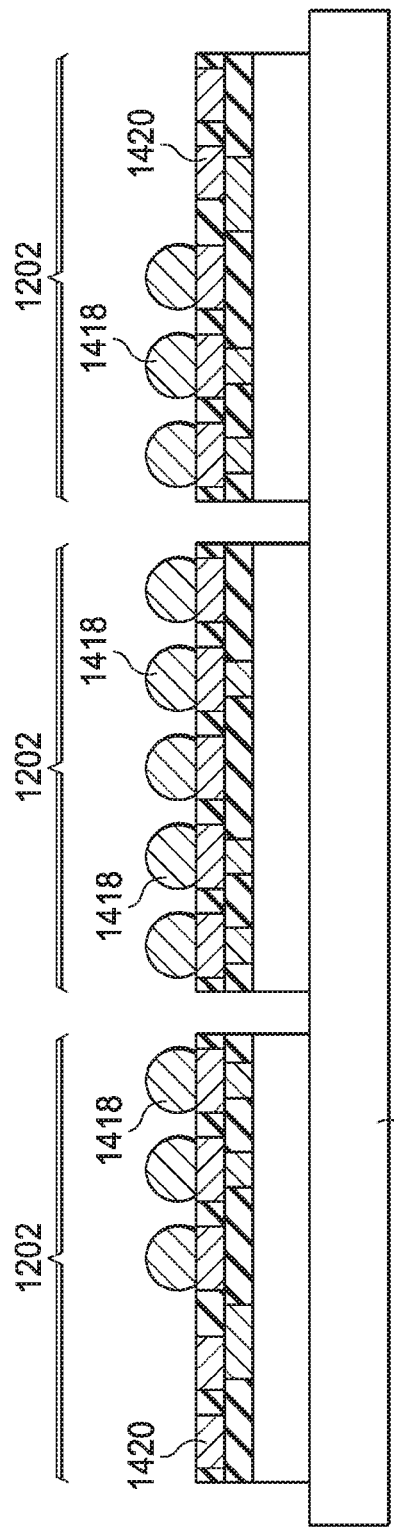

FIG. 14f is a diagram illustrating arrangement of the plurality of first integrated circuit dies 1202 according to an embodiment. In such an embodiment, one or more dies are mounted on a carrier 1422 and arranged or spaced to reflect the desired layout in a package. Each of the first integrated circuit dies 1202 may have a different pinout, land or bump configuration, and may be different dies or selected from different wafers. Conductive bumps 1418, such as UBM structures, are formed on some of the lands 1420. In the embodiment illustrated in FIG. 14f, the outer lands 1420 of the outer first integrated circuit dies 1202 are left without a conductive bump so that an interconnect 1410 may be applied in subsequent steps. Accordingly, conductive bumps 1418 are disposed between the empty lands 1420.

Figure 14G:
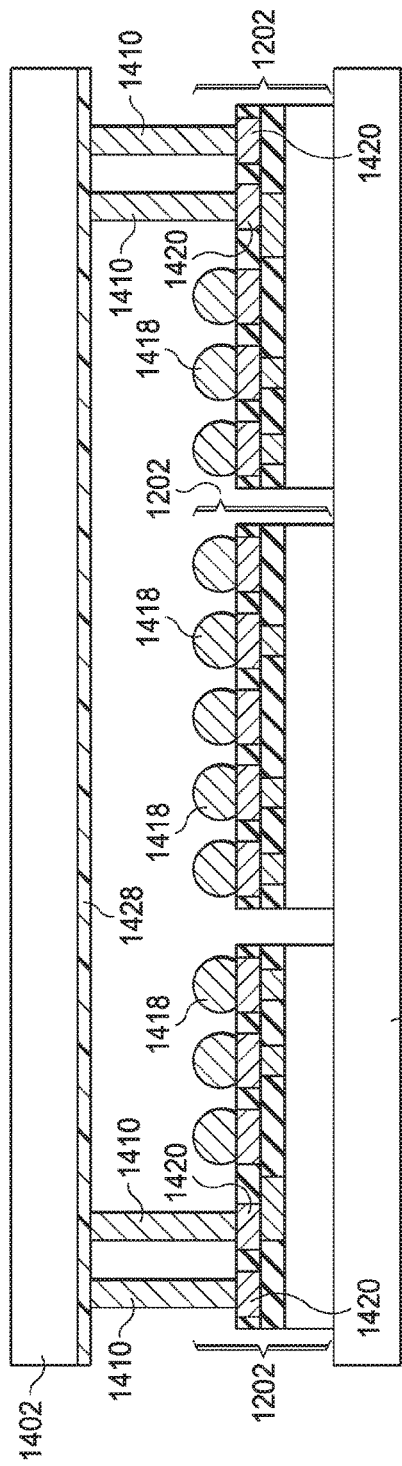

FIG. 14g is a diagram illustrating transfer of the interconnects 1410 to the plurality of first integrated circuit dies 1202 according to an embodiment. In some embodiments, the interconnects 1410 are bonded to lands 1420 of the first integrated circuit dies 1202 using a solder reflow, a solder paste, or another mechanical or chemical bonding technique.

Figure 14H:
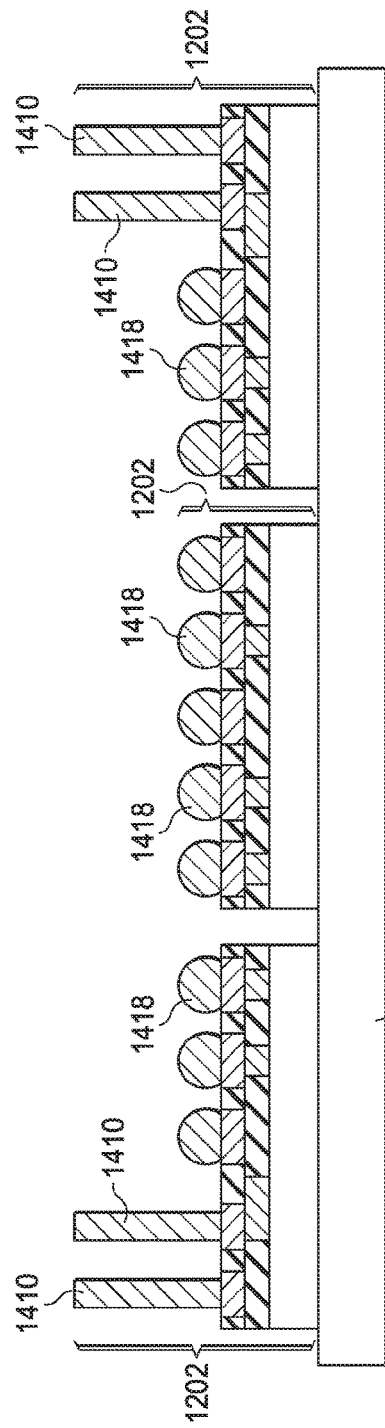

FIG. 14h is a diagram illustrating the first integrated circuit dies 1202 after transferring the interconnects 1410 according to some embodiments. The carrier 1402 is removed from the interconnects 1410, with the interconnects 1410 remaining attached to the first integrated circuit dies 1202. The carrier 1402 is separated from the interconnects 1410, for example, by deactivating the release layer 1428 using heat or a solvent.

FIG. 15a is a diagram illustrating a process step in forming interconnects 1410 by reflow and stretching according to an embodiment. Initially, interconnect material 1424 is plated on the carrier 1402 to a height that is shorter than the desired final interconnect height. The interconnect material 1424 is placed on lands 1420 by inverting the carrier 1402.

FIG. 15*b* is a diagram illustrating reflowing and stretching the interconnects 1410. The interconnect material 1424 is stretched to manipulate or change the shape, height or microstructure and form the interconnects 1410. The interconnect material 1424 is heated to about its melting point or higher, and the carriers 1402 and 1422 are moved apart to lengthen and thin the interconnect material 1424 to form the interconnects 1410. After the interconnect material 1424 is heated and reshaped, the interconnects 1410 are cooled in a controlled manner by reducing or stopping the applied heat. In some embodiments, the interconnects 1410 are cooled to room temperature after reflow and reshaping of the interconnect material 1424. The carrier 1402 is subsequently removed from the interconnects 1410 by deactivating the release layer 1428 so that the interconnects 1410 remain mounted on the lands 1420 of the first integrated circuit dies 1202.

Figure 16A:
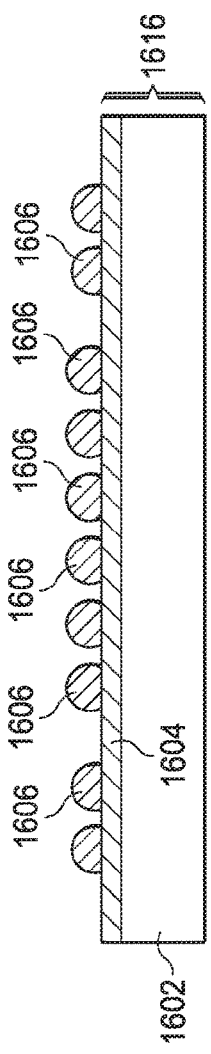
FIGS. 16a-16g are diagrams illustrating intermediate process steps for forming an interposer and mounting the first and second integrated circuit dies to the interposer according to some embodiments.

FIG. 16*a* is a diagram illustrating preparation of an interposer 1616 according to an embodiment. Initially a middle layer 1602 is provided and a first RDL 1604 is formed on the first side of the middle layer 1602. A second set of conductive bumps 1606 is formed on the first RDL 1604. In some embodiments, the middle layer 1602 is a semiconductor layer, or a semiconductor on insulator (SOI) layer with one or more active circuits or active devices disposed therein. For example, the middle layer 1602 has one or more decoupling capacitors, resistors, or the like, disposed therein. In other examples, the middle layer 1602 has one or more transistors or active circuits disposed therein, for example, for regulating power to attached dies, regulating transmissions by attached dies, activating or deactivating dies, or other functions. In some embodiments, the middle layer 1602 is free of through vias, reducing the cost of fabricating the interposer 1616. In such embodiments where the middle layer 1602 is free of through vias, dies attached to the interposer are connected to the substrate (see, e.g., FIGS. 17-18) by way of connections such as the tall interconnects 1410 that are disposed outside of the middle layer 1602.

The first RDL 1604 is formed from one or more metal layers disposed in one or more respective dielectric layers, with lands or other exposed portions permitting attachment and electrical connection of conductive bumps. In some embodiments, the second set of conductive bumps 1606 are conductive microbumps with a height of about 25 µm or less. Additionally, the second set of conductive bumps 1606 are formed as described above with respect to FIG. 8.

Figure 16B:
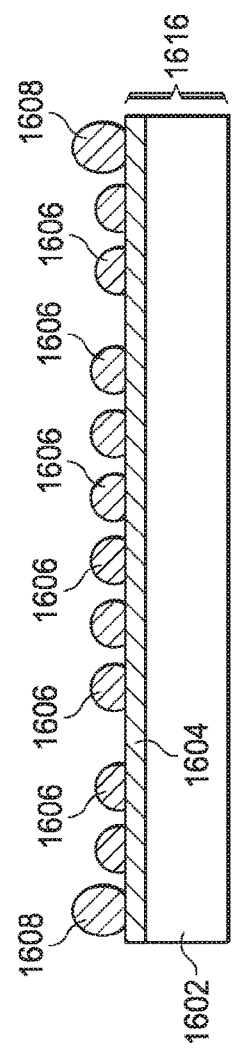

FIG. 16*b* is a diagram illustrating application of connectors such as a third set of conductive bumps 1608 according to some embodiments. The third set of conductive bumps 1608 is formed outside of the second set of conductive bumps 1606. In some embodiments, the third set of conductive bumps 1608 have a height greater than the second set of conductive bumps 1606. In some embodiments, the bumps of the third set of conductive bumps 1608 are conductive bumps with a height of about 90 µm or greater. Additionally, the third set of conductive bumps 1608 are formed as described above with respect to FIG. 7.

Figure 16C:
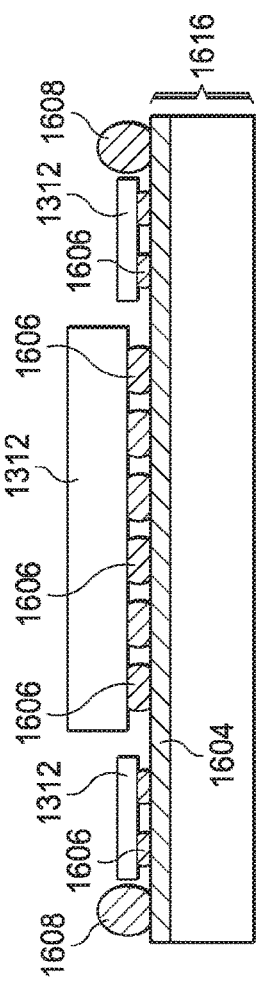

FIG. 16*c* is a diagram illustrating mounting the second integrated circuit dies 1312 according to an embodiment. The second integrated circuit dies 1312 are mounted to the second set of conductive bumps 1606 and between the third set of conductive bumps 1608. A chip-on-wafer (CoW) underfill (not shown) is applied in some embodiments, with the underfill disposed between the first RDL 1604 and the second set of integrated circuit dies 1312.

Figure 16D:
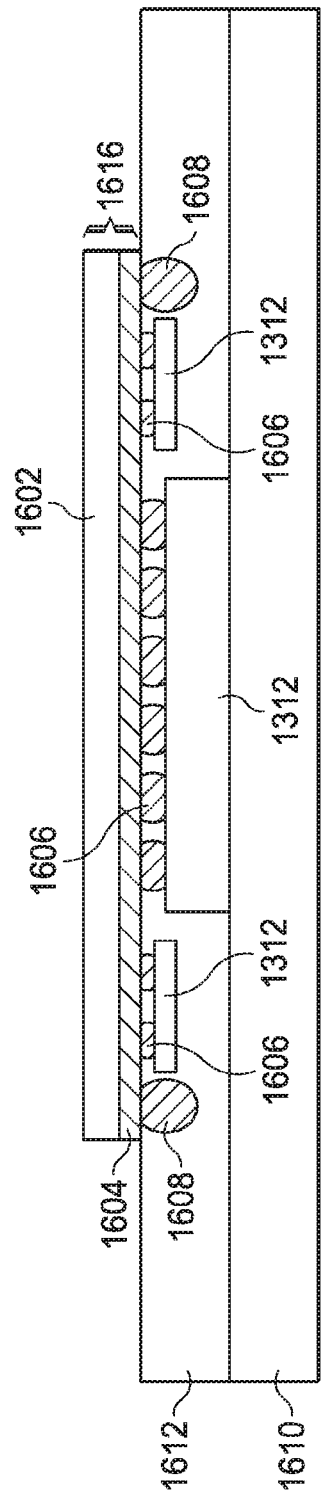

FIG. 16*d* is a diagram illustrating mounting of the package to a carrier 1610 according to an embodiment. The package with the interposer 1616 and second integrated circuit dies 1312 is inverted and is mounted to a carrier 1610, with the second set of integrated circuit dies 1312 facing the carrier. The package is attached to the carrier 1610 using an attachment film 1612 such as an adhesive, epoxy, die attachment film, or the like. In some embodiments, the backside of the middle layer 1602 is reduced in thickness by way of, for example, grinding, CMP, etching or another process. In some embodiments, the thickness of the middle layer 1602 is reduced, for example, from an original thickness between about 600 µm and about 900 µm to a thickness between about 90 µm and about 110 µm.

Figure 16E:
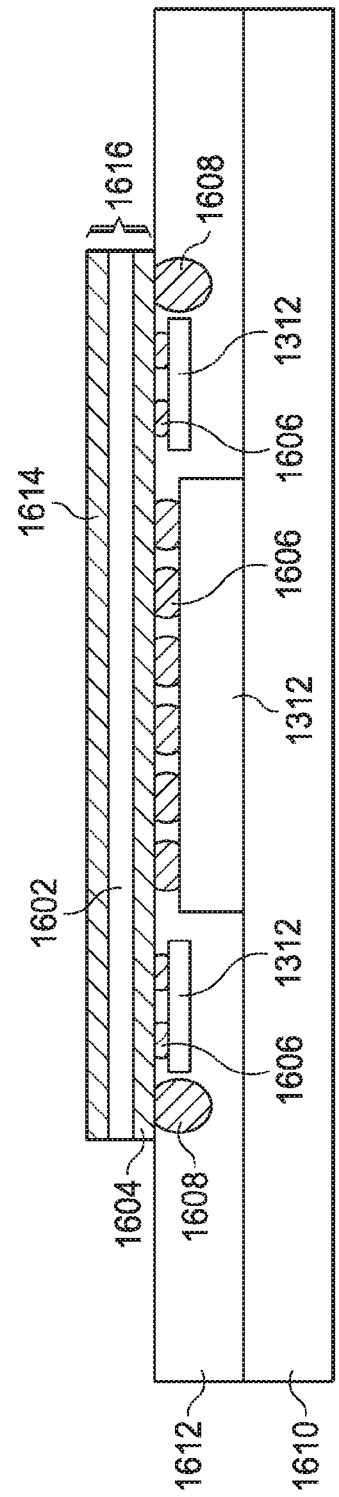

FIG. 16*e* is a diagram illustrating forming a second RDL 1614 on the interposer 1616 according to some embodiments. In some embodiments, the second RDL 1614 is formed on the backside of the interposer 1616 while the package is mounted in the carrier 1610. The second RDL 1614 has one or more lands or other exposed portions configured to accept conductive bumps.

Figure 16F:
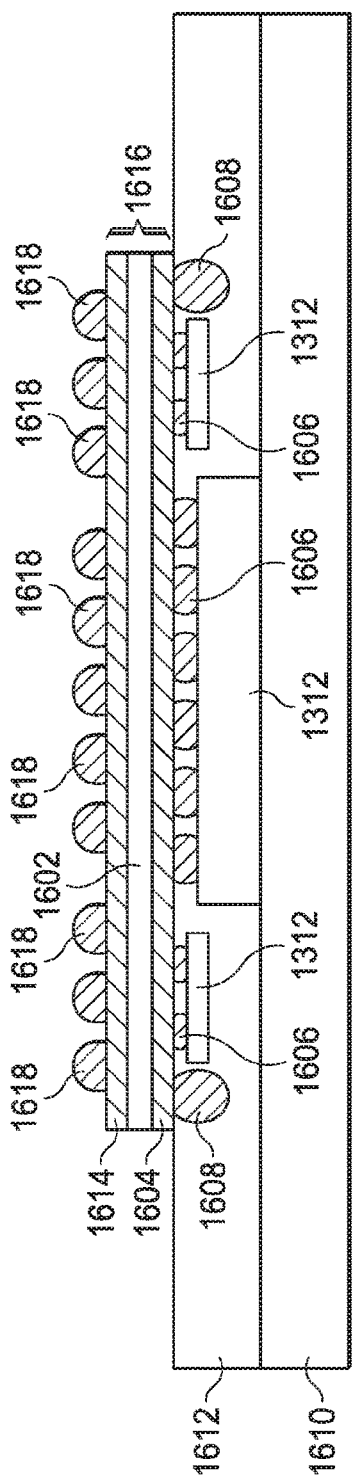

FIG. 16*f* is a diagram illustrating applying conductive bumps 1618 according to some embodiments. In some embodiments, the conductive bumps 1618 are conductive microbumps with a height of about 25 µm or less. Additionally, the conductive bumps 1618 are formed as described above with respect to FIG. 3.

Figure 16G:
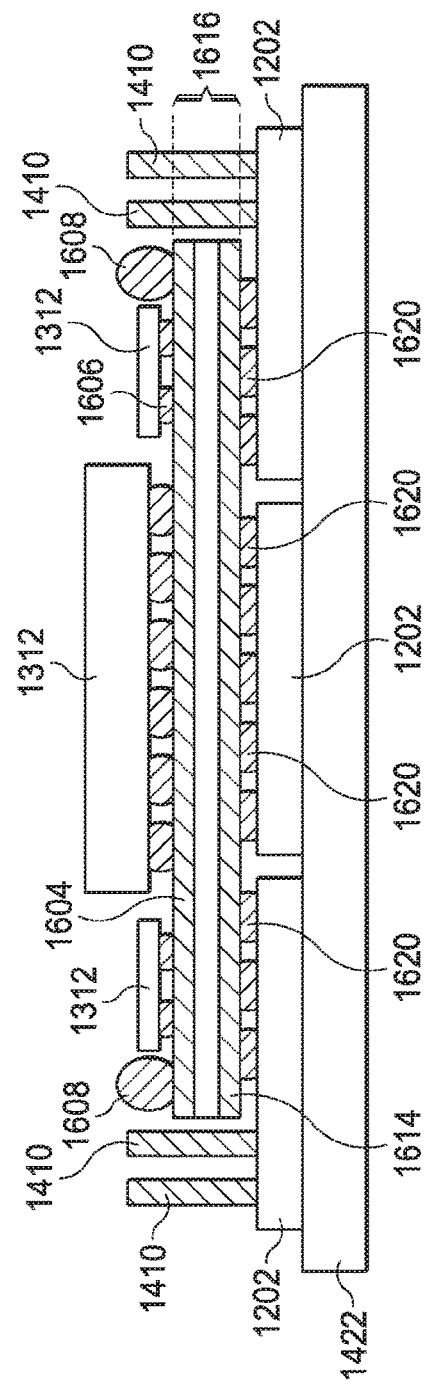

FIG. 16*g* is a diagram illustrating mounting the interposer 1616 with the second set of integrated circuit dies 1312 on the first set of integrated circuit dies 1202. The interposer 1616 with the second set of integrated circuit dies 1312 is inverted and released from the carrier 1610 so that the second RDL 1614 is mounted to the first set of integrated circuit dies 1202 by attaching the conductive bumps 1418 on the first set of integrated circuit dies 1202 to the conductive bumps 1618 on the interposer 1616, resulting in a second set of conductive bumps 1620. The height of the first set of conductive bumps 1620 results in a separation between the dies of the first set integrated circuit dies 1202 and the interposer 1616 that is, in some embodiments, between about 20 µm and about 50 µm, and in some embodiments, is about 25 µm.

Figure 17:
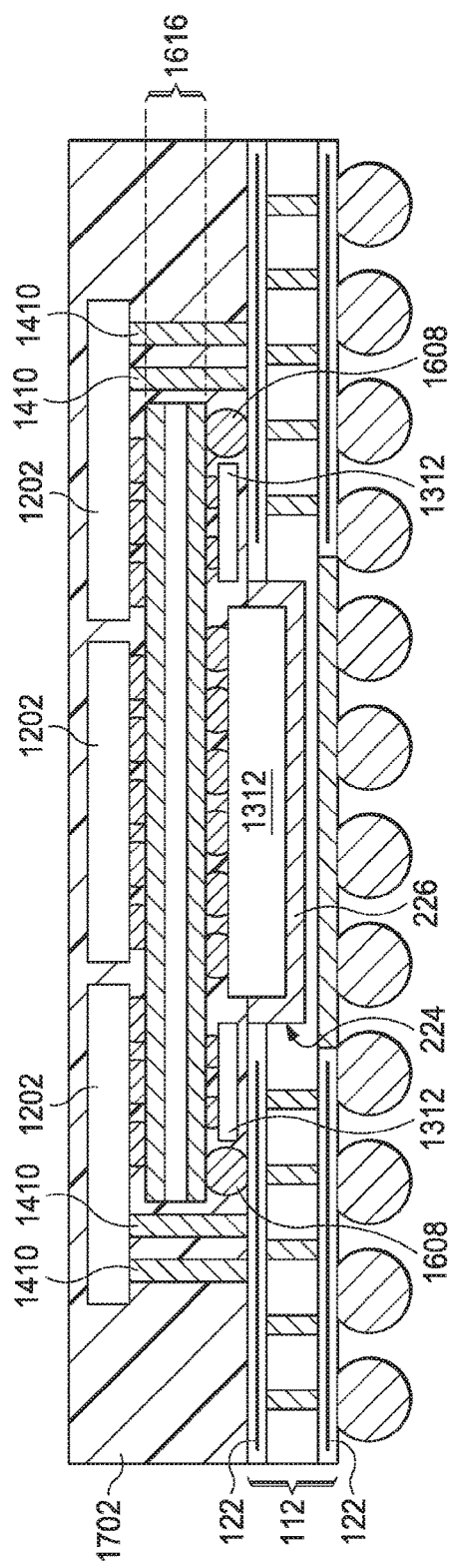
FIGS. 17-20 are diagrams illustrating devices with first integrated circuit dies at least partly connected to the substrate by interconnects according to some embodiments.

FIG. 17 is a diagram illustrating a device with tall interconnects 1410 and a plurality of first integrated circuit dies 1202 according to some embodiments. The interposer 1616 is mounted over the substrate 112 according to some embodiments. The interconnects are 1410 are joined to the substrate 112 such that at least one of the dies of the plurality of first integrated circuit dies 1202 are in signal communication or direct electrical contact with the substrate 112 by way of the interconnects 1410. In such an embodiment, the interconnects 1410 avoid contacting the interposer 1616. Additionally, in some embodiments, a molding compound 1702 is formed over the substrate 112 to encapsulate the first integrated circuit dies 1202, the interposer 1616 and the second integrated circuit dies 1312. In some embodiments, the molding compound 1702 is an epoxy, such as a curing or thermal set epoxy, a polyimide, a resin, a resist, a tape, a resist, an oxide or nitride, or another material.

It has been discovered that the dies of the first integrated circuit dies 1202 can be arranged to provide contact points for the interconnects 1410 outside of the interposer 1616 so that the interposer 1616 can be formed without through vias. Additionally, the third set of conductive bumps 1608 contacts the substrate 112, providing direct electrical connection between the interposer 1616 and the substrate 112. Thus, the first integrated circuit dies 1312 are disposed between ones of the third set of conductive bumps 1608 and also between ones of the interconnects 1410. Additionally, the disclosed embodiments provide a more compact form factor with higher package density and improved heat dissipation. The interposer 1616 shields the first integrated circuit dies 1202 from the second integrated circuit dies 1312 resulting in less thermal crosstalk between the dies.

In some embodiments, the substrate has a cavity, and one or more of the first integrated circuit dies 1312 extends into the cavity 224. In some embodiments, a thermal pad 226 is disposed in the cavity 224 to transfer heat from the first integrated circuit dies 1312.

Figure 18:
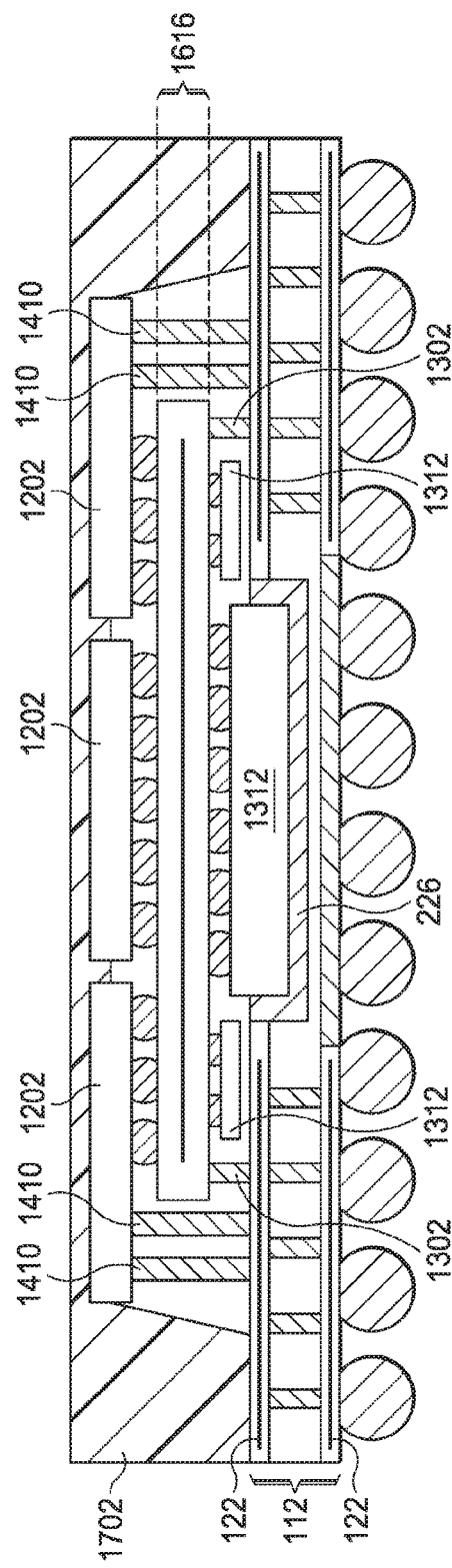

FIG. 18 is a diagram illustrating a device with interconnects 1302 between the substrate 112 and the interposer 1616. In such an embodiment, one or more interconnects 1302 may be formed on the interposer 1616 by masking and plating, stretching, by placing a preformed stud structure, by forming a stud with a wirebonder, or by another technique.

Figure 19:
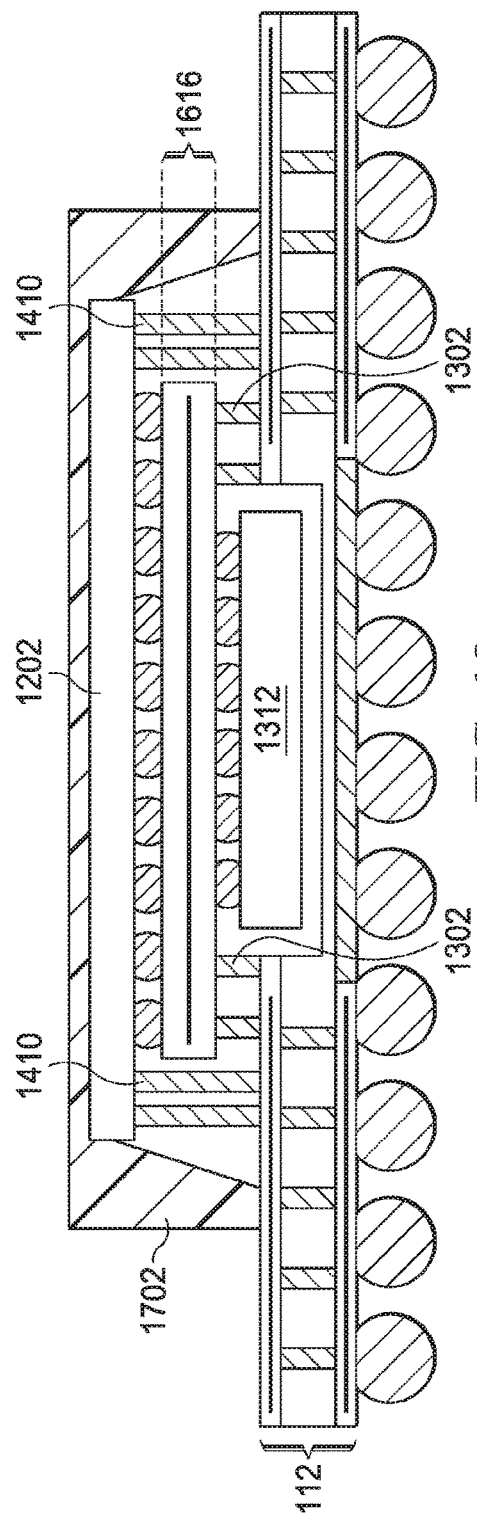

FIG. 19 is a diagram illustrating a device with tall interconnects 1410 and a single first integrated circuit die 1202 according to some embodiments. In such an embodiment, a single first integrated circuit die 1202 extends past the edges of the interposer 1616, with interconnects 1410 connecting the first integrated circuit die 1202 to the substrate at opposing edges of the interposer 1616. Furthermore, in some embodiments, the interposer 1616 is electrically connected to the substrate 112 by one or more interconnects 1302, by the third set of conductive bumps 1605, or another conductive connector.

Figure 20:
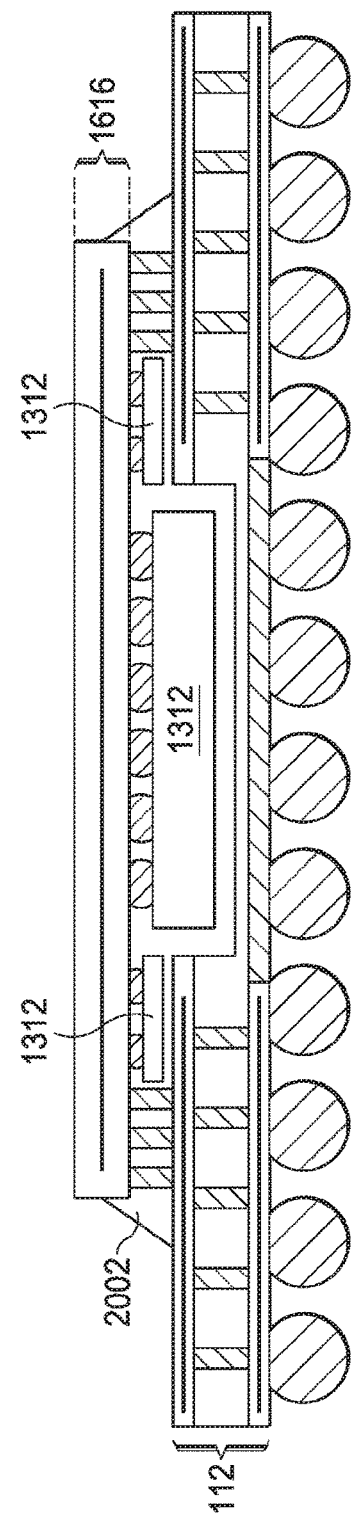

FIG. 20 is a diagram illustrating a device with an interposer 1616 free of first integrated circuit devices. In such an embodiment, the first integrated circuit dies 1202 and interconnects 1410 are omitted. Furthermore, in some embodiments, the interposer 1616 is electrically connected to the substrate 112 by one or more interconnects 1302, providing electrical communication between the second integrated circuit dies 1312 and the substrate through the interposer 1616.

Figure 21J:
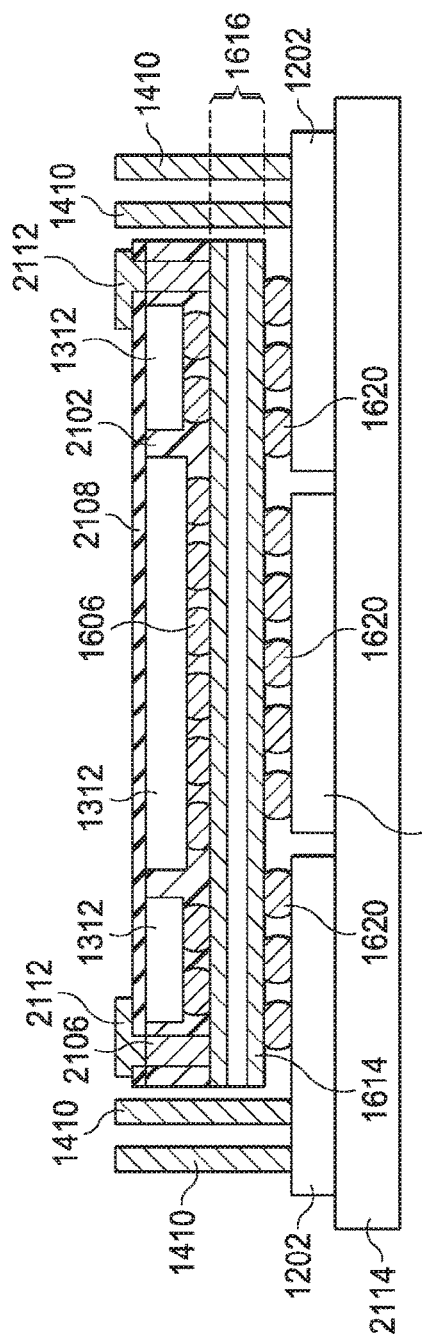

FIGS. 21*a*-21*k* are diagrams illustrating intermediate process steps for forming tall interconnects by masking and plating according to some embodiments. Referring initially to FIG. 21*a*, mounting of the second integrated circuit dies 1312 on an interposer 1616 according to some embodiments is illustrated. One or more second integrated circuit dies 1312 are mounted on the first RDL 1604 of an interposer 1616 by a second set of conductive bumps 1606. A first molding compound 2102 is formed over the second integrated circuit dies 1312.

FIG. 21*b* is a diagram illustrating planarization of the first molding compound 2102 according to some embodiments. The first molding compound 2102 is reduced in thickness, using, for example, a grinding, CMP, etching or another process. In some embodiments, the backsides of second integrated circuit dies 1312 are reduced at the same time as the first molding compound 2102. The backsides of the second integrated circuit dies 1312 are substantially planar with the surface of the molding compound 2102 after the planarization.

FIG. 21*c* is a diagram illustrating patterning the molding compound 2102 according to some embodiments. The first molding compound 2102 is patterned to create openings 2104 through the first molding compound 2102 and exposing the first RDL 1604. In an embodiment, the first molding compound 2102 is patterned using a laser, and in other embodiments, the first molding compound 2102 is patterned using masking and etching, photolithography or another technique.

FIG. 21*d* is a diagram illustrating formation of interconnects 2106 according to some embodiments. The interconnects 2106 are, in some embodiments, formed by deposition of a conductive material, for example, by electroplating, ECP, electroless plating, CVD, or another metal deposition process. In such embodiments, the interconnects 2106 are formed from copper, aluminum, nickel, titanium, tungsten, gold, an alloy, or another conductive material. The interconnects 2106 are formed in the openings 2104 in the first molding compound 2102 and extend from the top surface of the first molding compound 2102 to the first RDL 1604.

FIG. 21*e* is a diagram illustrating formation of a protective layer 2108 over the first molding compound 2102 according to some embodiments. In some embodiments, the protective layer 2108 is formed from a nitride, such as a low temperature nitride, or from an oxide, polyimide, or the like. The protective layer 2108 is patterned during or after formation to expose the interconnects 2106. Patterning the protective layer 2108 creates openings 2110 over the interconnects 2106 and extending through the protective layer 2108 to the underlying interconnects 2106.

FIG. 21*f* is a diagram illustrating formation of a post-passivation interconnects (PPIs) 2112 over the protective layer 2108 according to some embodiments. The PPIs 2112 are formed from a conductive material such as, for example, copper, aluminum, nickel, titanium, tungsten, gold, an alloy or another conductive material. In some embodiments, the PPIs 2112 are formed using a deposition, masking and etching process. The PPIs 2112 each have a portion disposed over the top surface of the protective layer 2108 (in the depicted orientation), with a second portion extending through the protective layer 2108 and contacting the interconnect 2106.

FIG. 21*g* is a diagram illustrating mounting the package to a carrier 2114 and grinding of the interposer 1616 according to some embodiments. The package is inverted and is mounted to a carrier 2114, with the second set of integrated circuit dies 1312 facing the carrier 2114. The package is mounted to the carrier by attaching the PPIs 2112 to the carrier 2114 with an adhesive, die attachment film, tape or the like. The backside of the middle layer 1602 is, in some embodiments, reduced in thickness by way of, for example, grinding, CMP, etching or another process. In some embodiments, the thickness of the middle layer 1602 is reduced to a thickness between about 90 μm and about 110 μm.

FIG. 21*h* is a diagram illustrating forming a second RDL 1614 on the interposer 1616 according to some embodiments. In some embodiments, the second RDL 1614 is formed on the backside of the interposer 1616 while the package is mounted in the carrier 2114. The second RDL 1614 has one or more lands or other exposed portions configured to accept conductive bumps.

FIG. 21*i* is a diagram illustrating applying conductive bumps 1618 according to some embodiments. In some embodiments, the conductive bumps 1618 are conductive bumps with a height of about 25 μm or less. Additionally, the conductive bumps 1618 are formed as described above with respect to FIG. 3.

FIG. 21*j* is a diagram illustrating mounting the interposer 1616 with the second set of integrated circuit dies 1312 on the first set of integrated circuit dies 1202. The interposer 1616 with the second set of integrated circuit dies 1312 is inverted and released from the carrier 2114. The second RDL 1614 is mounted to the first set of integrated circuit dies 1202 by attaching the conductive bumps 1418 on the first set of integrated circuit dies 1202 to the conductive bumps 1618 on the interposer 1616, resulting in a second set of conductive bumps 1620. The height of the first set of conductive bumps 1620 results in a separation between the dies of the first set of integrated circuit dies 1202 and the interposer 1616 that is, in some embodiments, between about 20 µm and about 50 µm, and in some embodiments, about 25 µm. Additionally, the height of the first set of conductive bumps 1620 results in the uppermost surfaces (in the depicted orientation) of the interconnects 1410 and the PPIs 2112 being roughly planar or level.

Figure 21K:
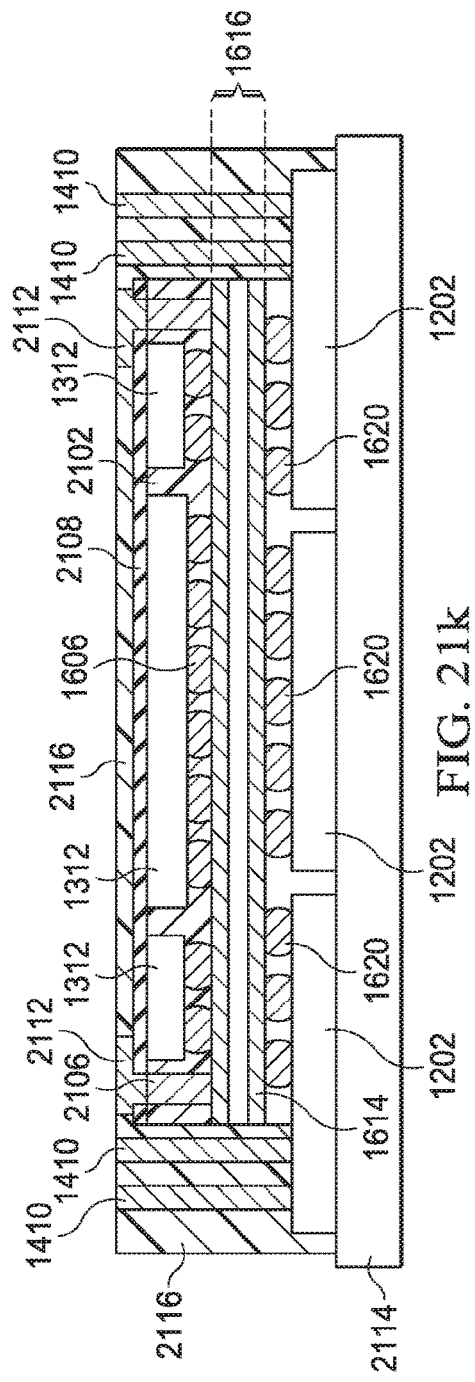

FIG. 21*k* is a diagram illustrating forming a second molding compound 2116 over the package according to some embodiments. The second molding compound 2116 is formed over the protective layer 2108 and encapsulates the first molding compound 2102 and interconnects 1410, and contacts a least a portion of the one of the first integrated circuit dies 1202. In some embodiments, the second molding compound 2116 is planarized to expose the surfaces of the interconnects 1410 and the PPIs 2112 and planarize the surfaces of the interconnects 1410, PPIs 2112 and second molding compound 2116.

Figure 22:
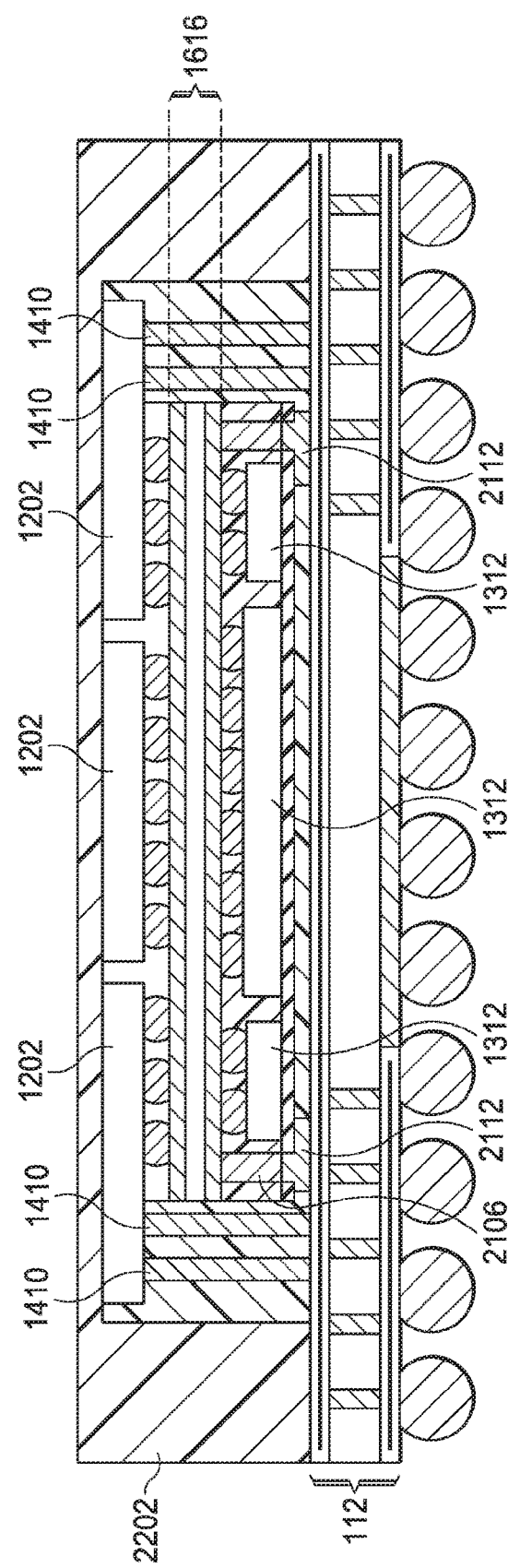
FIGS. 22 and 23 are diagrams illustrating with first integrated circuit dies at least partially connected to the substrate with interconnects according to some embodiment and with various embodiments of interconnects connecting the interposer to the substrate.

FIG. 22 is a diagram illustrating a device with tall interconnects 1410 and a plurality of first integrated circuit dies 1202 according to some embodiments. The interposer 1616 is mounted over the substrate 112 according to some embodiments, with the PPIs 2112 providing mounting points for the interposer 1616 on the substrate 112. Each of the interconnects 2106 is electrically connected to respective ones of the PPIs 2112 and provides electrical connectivity between the interposer 1616 and the substrate 112. Additionally, the interconnects 1410 are joined to the substrate 112 such that at least one of the dies of the plurality of first integrated circuit dies 1202 are in signal communication or direct electrical contact with the substrate 112 by way of the interconnects 1410, with the interconnects 1410 avoiding contacting the interposer 1616.

In some embodiments, a third molding compound 2202 is formed over the substrate 112 to encapsulate the first integrated circuit dies 1202, the interposer 1616 and the second integrated circuit dies 1312. In some embodiments, the third molding compound 2202 is an epoxy, such as a curing or thermal set epoxy, a polyimide, a resin, a resist, a tape, a resist, an oxide or nitride, or another material.

It has been discovered that the interconnects 1410 provide communication between the first integrated circuit dies 1202 and the substrate while avoiding communication through the body of the interposer 1616, permitting the interposer 1616 to be fabricated without through vias, lowering production costs. Additionally, separating the dies permits higher density packaging while eliminating thermal crosstalk between dies on opposing sides of the interposer 1616.

In some embodiments, the substrate has a cavity, and one or more of the first integrated circuit dies 1312 extends into the cavity 224. In some embodiments, a thermal pad 226 is disposed in the cavity 224 to transfer heat from the first integrated circuit dies 1312.

Figure 23:
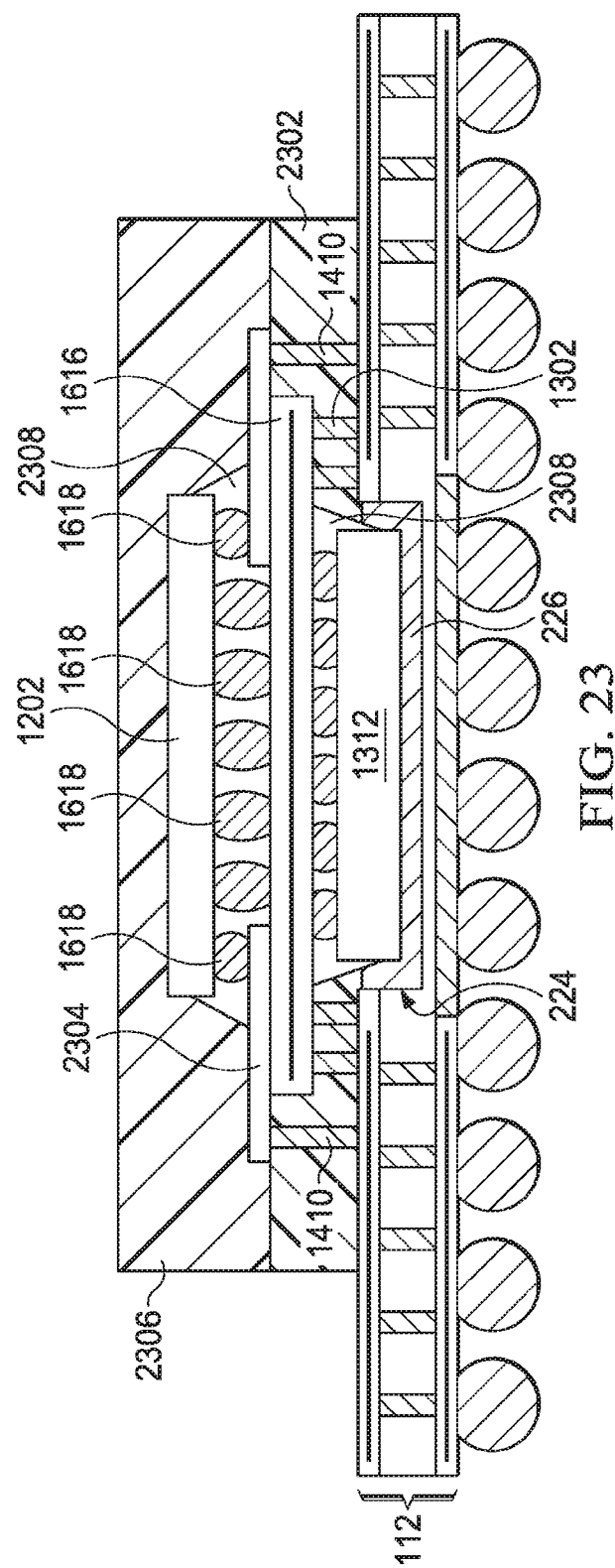

FIG. 23 is a diagram illustrating a device having a first integrated circuit die 1202 smaller than the interposer 1616 that is connected to the substrate with a fan-out structure 2304 and interconnects 1410 according to some embodiments. A substrate 112 has an interposer 1616 mounted thereon by way of interconnects between the substrate 112 and the interposer 1616. In some embodiments, the interposer 1616 has a second integrated circuit die 1312 disposed on the bottom side and extending into a cavity in the substrate 112.

The first integrated circuit die 1202 is mounted on the top surface of the interposer 1616. The edges of the interposer 1616 extend beyond the edges of the first integrated circuit die 1202. A fan out structure 2304 is disposed over part of the interposer top surface, and extends past the edges of the interposer 1616. The fan-out structure 2304 is electrically connected to the interconnects 1410 and has one or more conductive bumps 1618 electrically connecting the first integrated circuit die 1202 to the fan-out structure 2304. The conductive bumps 1618 also electrically connect the first integrated circuit die 1202 to the top side of the interposer 1616. The fan-out structure 2304 is, in some embodiments, formed extending over a first molding compound 2302, with the interconnects 1410 extending through the first molding compound 2302 and connecting the fan-out structure 2304 to the substrate 112. A second molding compound 2306 is formed over the first molding compound 2302 to encapsulate the first integrated circuit die 1202 and the fan-out structure 2304. It has been discovered that the fan-out structure permits the first integrated circuit die 1202 to communicate with the substrate 112 outside of the interposer 1616, permitting the interposer 1616 to be formed without through vias.

Figure 24:
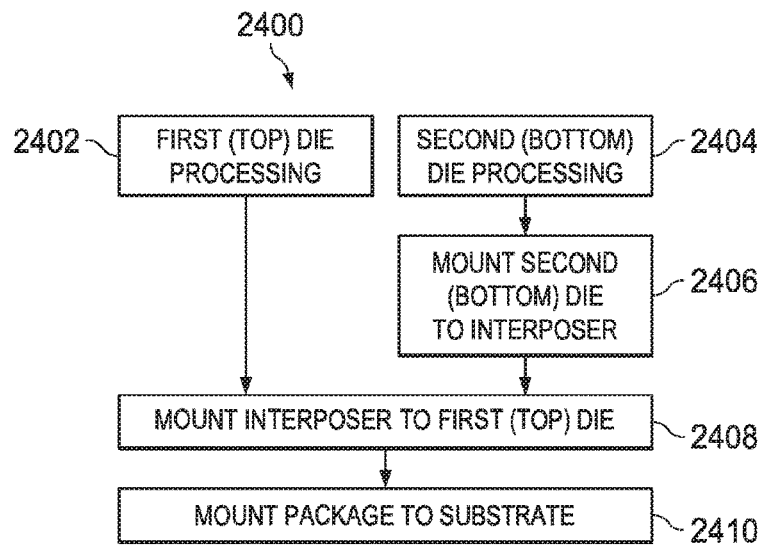
FIGS. 24-27 are flow diagrams illustrating processes for forming devices according to some embodiments.

FIG. 24 is a flow diagram illustrating a method 2400 of forming devices according to some embodiments. The first integrated dies are processed in block 2402. The second integrated circuit dies are processed in block 2404. The second integrated circuit die is mounted to the interposer in block 2406. The interposer and attached second integrated circuit die are mounted to the first integrated circuit dies in block 2408. The package with the interposer and first and second integrated circuit dies is mounted to the substrate in block 2410.

Figure 25:
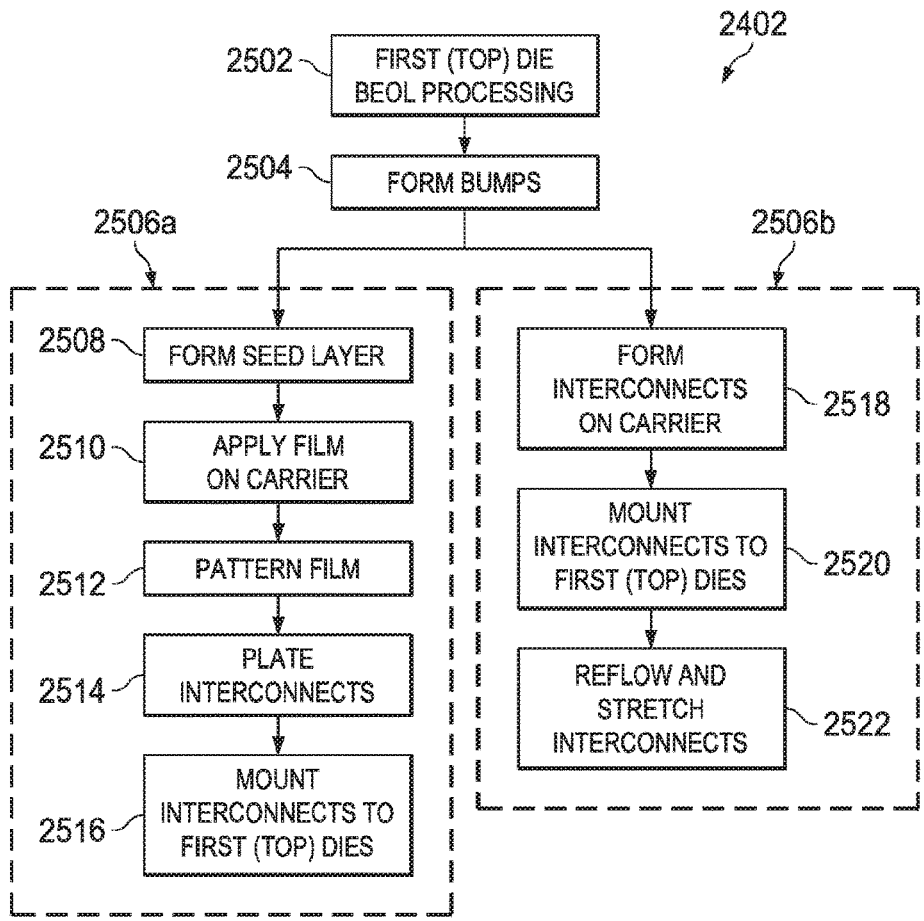

FIG. 25 is a flow diagram illustrating a method 2402 for first integrated circuit die processing according to some embodiments. The first integrated circuit dies are processed with BEOL processes in block 2502. For example, in some embodiments, the dies are finished with passivation layers, RDLs, or the like as part of the BEOL process. One or more bumps are formed on the first integrated circuit dies in block 2504. In some embodiments, interconnect are formed with an interconnect plating process in block 2506*a*, or with an interconnect reflow/stretching process in block 2506*b*.

The interconnect plating process of block 2506 comprises forming a seed layer over a carrier in block 2508. A film mask is applied on the carrier and over the seed layer in block 2510. The film mask is patterned in block 2512. Interconnects are plated in openings in the patterned film mask in block 2514. The plated interconnects are mounted to the first integrated circuit dies in block 2516.

The interconnect reflow/stretching process of block 2506*b* comprises forming interconnects on a carrier in block 2518. The interconnects are mounted to the first integrated circuit dies in block 2520. The interconnects are heated until they reflow and are stretched in block 2522.

Figure 26:
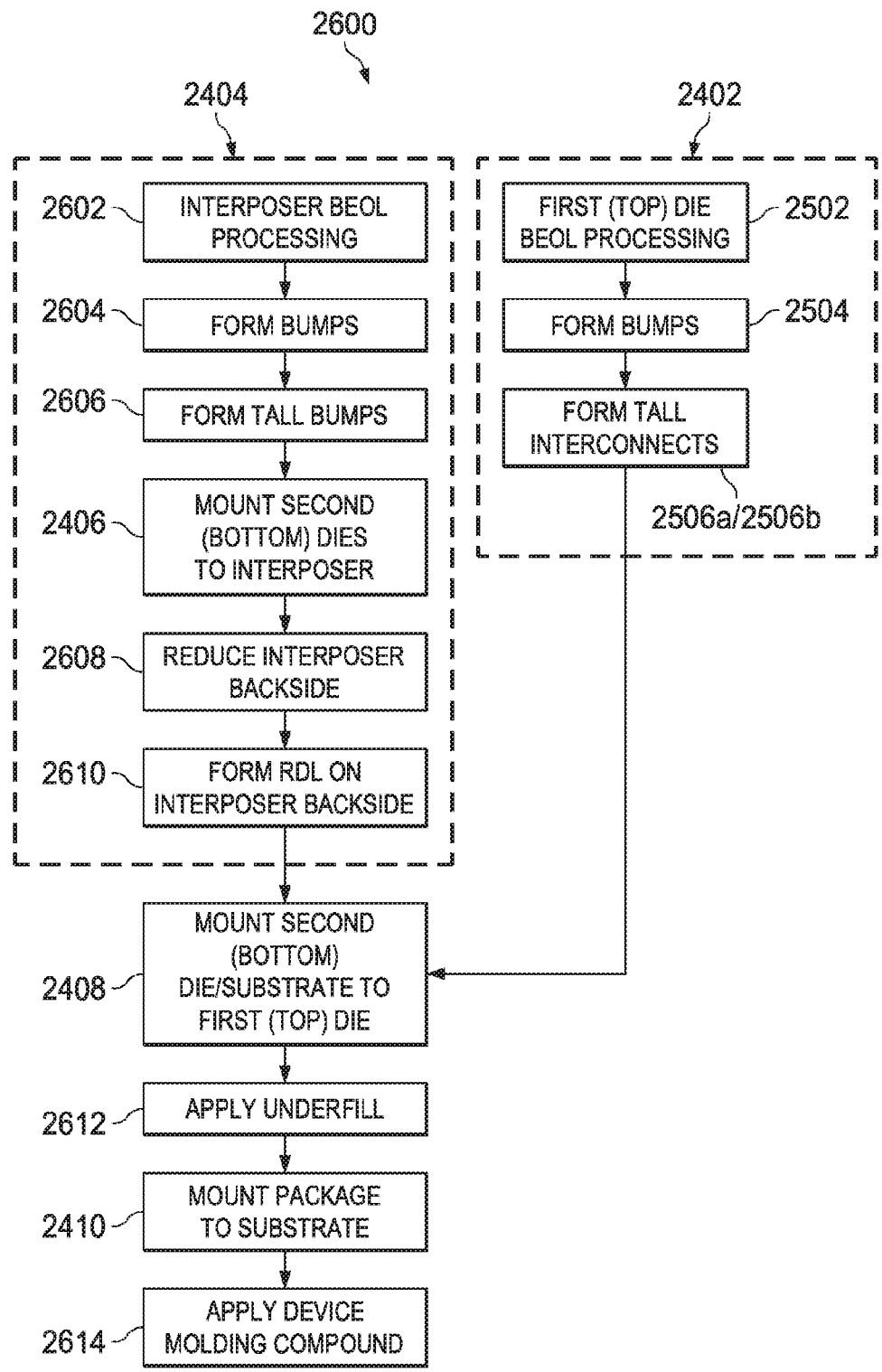

FIG. 26 is a flow diagram illustrating a method 2600 for forming a device with interconnects according to some embodiments. The first integrated circuit dies are processed in block 2402, with the first integrated circuit BEOL processing in block 2502, bump formation in block 2504 and interconnect formation in blocks 2506*a* or 2506*b*. The second integrated circuit die processing is performed in block 2404. The second integrated circuit die processing comprises providing a first portion of the interposer by performing BEOL interposer processing in block 2602, with the BEOL processing of the interposer comprising forming a middle layer and a first RDL on the middle layer. Microbumps are formed on the interposer in block 2604 and taller bumps are formed outside the microbumps in block 2606. The second integrated circuit dies are mounted to the interposer by way of the microbumps in block 2406. The backside of the interposer is reduced in block 2608, and a second RDL is formed on the backside of the interposer in block 2610. The interposer with attached second integrated circuit dies are mounted on the first integrated circuits by way of the bumps on the first integrated circuit dies between the interconnects in block 2408. An underfill is applied between the interposer and the first and second integrated circuit dies in block 2612. The package with the interposer and first and second integrated circuit dies is mounted to the substrate by way of the interconnects and the larger bumps in block 2410. A device molding compound is formed over the package and substrate in block 2614.

Figure 27:
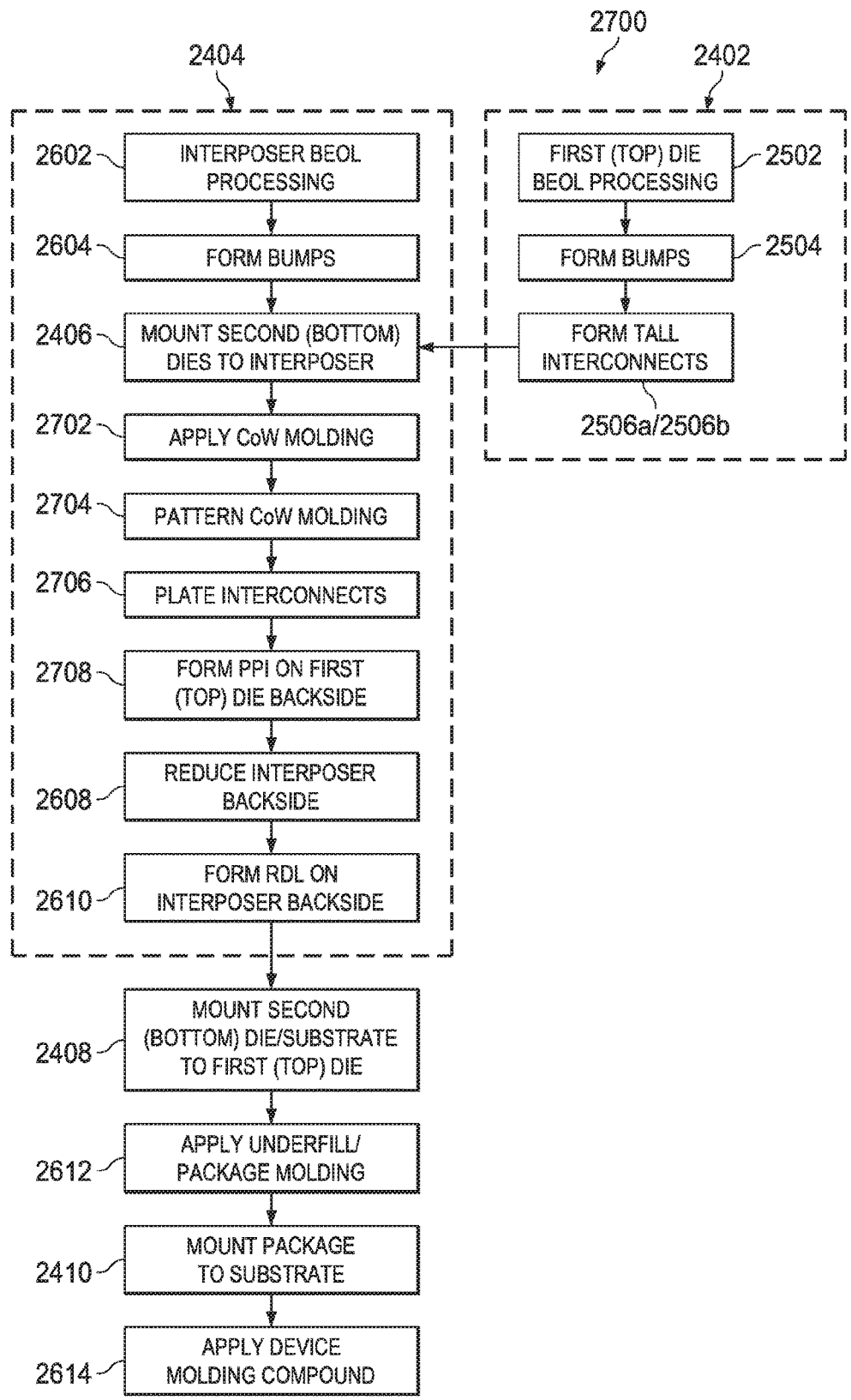

FIG. 27 is a flow diagram illustrating a method 2700 for forming a device with PPIs and interconnects between the interposer and substrate according to some embodiments. The first integrated circuit dies are processes in block 2402, with the first integrated circuit BEOL processing in block 2502, bump formation in block 2504 and interconnect formation in blocks 2506a or 2506b. The second integrated circuit die processing is performed in block 2404. The second integrated circuit die processing comprises providing a first portion of the interposer by performing BEOL interposer processing in block 2602, with the BEOL processing of the interposer comprising forming a middle layer and a first RDL on the middle layer. Microbumps are formed on the interposer in block 2604. The second integrated circuit dies are mounted the interposer by way of the microbumps in block 2406. A chip-on-wafer molding is formed on the interposer and over the second integrated circuit dies in block 2702, and the CoW molding is patterned in block 2704. Interconnects are plated in the patterned CoW molding in block 2706. A protective layer is formed on the CoW molding over the first integrated circuit dies, and a PPI is formed through openings in the protective layer in block 2708. The backside of the interposer is reduced in block 2608, and a second RDL is formed on the backside of the interposer in block 2610. The interposer with attached second integrated circuit dies is mounted on the first integrated circuits by way of the bumps on the first integrated circuit dies and between the interconnects in block 2408. An underfill is applied between the interposer and the first and second integrated circuit dies in block 2612. The package with the interposer and first and second integrated circuit dies is mounted to the substrate by way of the interconnects in block 2410. A device molding compound is formed over the package and substrate in block 2614.

Although the present disclosure and its advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

Embodiments discussed herein provide a 3D semiconductor package using an interposer.

In accordance with an embodiment, an interposer is provided having a first die electrically coupled to a first side of the interposer and a second die electrically coupled to a second side of the interposer. Conductive bumps on the interposer electrically couple the interposer to a substrate, which may be a packaging substrate, a high-density interconnect, a printed circuit board, or the like. The substrate has a cavity such that the second die, which is electrically coupled to the interposer, is positioned within the cavity. The use of a cavity may allow smaller conductive bumps to be used, thereby allowing a higher number of conductive bumps to be used. A thermal pad may be placed within the cavity and/or the substrate may comprise a heat conductive pad to aid in the dissipation of the heat from the second die.

According to an embodiment, a method of forming a device comprises mounting a plurality of first interconnects on one or more first integrated circuit dies. One or more second integrated circuit dies are mounted on a first side of an interposer. The interposer is mounted to at a second side to the first integrated circuit dies, the plurality of first interconnects disposed outside of the interposer. The interposer is mounted to a first side of a substrate by attaching the first interconnects to the substrate, the substrate in signal communication with one or more of the first integrated circuit dies through the first interconnects.

According to another embodiment, a method of forming a device comprises forming one or more first interconnects on one or more first integrated circuit dies. One or more second integrated circuit dies are mounted on a first redistribution line (RDL) structure disposed at a first side of an interposer and a second RDL is formed on the interposer, the second RDL separated from the first RDL by a middle layer. The interposer is mounted on the one or more first integrated circuit dies by attaching the one or more first integrated circuit dies to a first surface of the second RDL. The interposer is mounted on a substrate by attaching a first end of each of the one or more first interconnects to the substrate, a second end of each of the one or more first interconnects extending past the middle layer, the first RDL nearer the substrate than the second RDL. The substrate is in signal communication with at least one of the one or more first integrated circuit dies through the one or more first interconnects.

According to an embodiment, a device comprises an interposer having a first redistribution line (RDL) structure disposed at a first side and a second RDL disposed at a second side opposite the first side, the first RDL separated from the second RDL by a middle layer. One or more first integrated circuit dies are disposed on the second RDL and one or more second integrated circuit dies are disposed on the first RDL. A substrate is disposed under the interposer, the first RDL closer to the substrate than the second RDL. One or more first interconnects are disposed outside of the interposer, each of the one or more first interconnects having a first end attached to the substrate and a second end extending past the middle layer, the substrate in signal communication with the one or more first integrated circuit dies by way of the one or more first interconnects. One or more first connectors are disposed between, and electrically connected to, the interposer and second integrated circuit dies. One or more second connectors are disposed between and electrically connecting the first RDL and the substrate.

According to an embodiment, a device comprises a substrate having a top surface, and an interposer over the top surface of the substrate and having a first major surface facing the substrate. The interposer has a first redistribution line (RDL) disposed at the first major surface thereof and a second RDL disposed at a second major surface thereof opposite the first major surface. A first integrated circuit die is mounted to the second RDL, and a second integrated circuit die is mounted to the first RDL. An interconnect extending outside a periphery of the interposer electrically connects the substrate to the first integrated circuit die. A first connector electrically connects the interposer and the second integrated circuit die, and a second connector electrically connects the first RDL and the substrate.

According to an embodiment, a device comprises a substrate having a top surface, and an interposer over the top surface of the substrate, wherein the interposer is connected to the substrate by a first plurality of connectors. A first integrated circuit die is connected to a first side of the interposer by a second plurality of connectors, and a second integrated circuit die is connected to a second side of the interposer opposite the first side by a third plurality of connectors and is connected to the substrate by a fourth plurality of connectors.

According to an embodiment, a device comprises a substrate having a top surface. An interposer is over the top surface of the substrate and is connected to the substrate by first interconnects. A first integrated circuit die is connected to a first side of the interposer by first connectors. A second integrated circuit die is connected to a second side of the interposer opposite the first side by second connectors. The second integrated circuit die has a smaller footprint than the interposer. A fan-out structure is disposed over a top surface of the interposer and extends beyond outermost edges of the interposer. The fan-out structure is electrically connected to second interconnects, and the second interconnects are in contact with the top surface of the substrate.

One general aspect of embodiments disclosed herein includes a device, including: a substrate having a top surface; an interposer over the top surface of the substrate, the interposer being connected to the substrate by first interconnects; a first integrated circuit die connected to a first side of the interposer by first connectors; a second integrated circuit die connected to a second side of the interposer opposite the first side by second connectors, the second integrated circuit die having a smaller footprint than the interposer; and a fan-out structure disposed over a top surface of the interposer and extending beyond outermost edges of the interposer, where the fan-out structure is electrically connected to second interconnects, the second interconnects in contact with the top surface of the substrate.

Another general aspect of embodiments disclosed herein includes a device including: a substrate; an interposer on the substrate; a first integrated circuit mounted on a first major surface of the substrate and a second integrated circuit mounted on a second major surface of the interposer, the second major surface being opposite the first major surface; a fan-out structure on the second major surface of the interposer, the fan-out structure extending beyond an outer periphery of the second major surface of the interpose; a first interconnect electrically connecting one end of the fan-out structure to the second integrated circuit; and a second interconnect electrically connecting another end of the fan-out structure to the substrate.

Yet another general aspect of embodiments disclosed herein includes a device including: a substrate having a cavity in a top surface thereof; a first integrated circuit die mounted within the cavity; an interposer having a bottom surface mounted to the first integrated circuit die; a second integrated circuit die mounted to a top surface of the interposer, where a length of the second integrated circuit die in a first direction is less than a length of the interposer in the first direction; a fan-out structure on the top surface of the interposer, the fan-out structure extending beyond an outer periphery of the interposer; a first conductive bump having a first height and connecting the second integrated circuit to the interposer; a second conductive bump having a second height less than the first height and connecting the second integrated circuit to the fan-out structure; a first interconnect having a first height and connecting the fan-out structure to the substrate; and a second interconnect having a second height less than the first height and connecting the interposer to the substrate.

Other embodiments are disclosed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a substrate having a top surface;
an interposer over the top surface of the substrate, the interposer being connected to the substrate by first interconnects;
a first integrated circuit die connected to a first side of the interposer by first connectors;
a second integrated circuit die connected to a second side of the interposer opposite the first side by second connectors, the second integrated circuit die having a smaller footprint than the interposer; and
a fan-out structure disposed over a top surface of the interposer and extending beyond outermost edges of the interposer, wherein the fan-out structure is electrically connected to second interconnects, the second interconnects in contact with the top surface of the substrate.

2. The device of claim 1, further comprising third connectors connecting the fan-out structure to the second integrated circuit die.

3. The device of claim 1, further comprising a cavity in the top surface of the substrate, wherein the first integrated circuit die extends into the cavity.

4. The device of claim 1, further comprising:
a first molding compound on sidewalls of the interposer, the first interconnects, and the second interconnects; and
a second molding compound on the first molding compound, the fan-out structure, and the second integrated circuit die.

5. The device of claim 1, wherein the interposer comprises a first redistribution layer (RDL) facing the first integrated circuit die, a middle layer, and a second RDL facing the second integrated circuit die.

6. The device of claim 1, wherein the second interconnects comprise respective conductive pillars extending through a molding compound.

7. The device of claim 1, wherein the interposer is free of through vias extending therethrough.

8. A device comprising:
a substrate;
an interposer on the substrate;
a first integrated circuit mounted on a first major surface of the substrate and a second integrated circuit mounted on a second major surface of the interposer, the second major surface being opposite the first major surface;
a fan-out structure on the second major surface of the interposer, the fan-out structure extending beyond an outer periphery of the second major surface of the interpose;
a first interconnect electrically connecting one end of the fan-out structure to the second integrated circuit; and
a second interconnect electrically connecting another end of the fan-out structure to the substrate.

9. The device of claim 8, wherein the first integrated circuit in mounted within a cavity in the substrate.

10. The device of claim 9, wherein the cavity is at least partially lined with a thermal pad.

11. The device of claim 8, wherein the second interconnect is embedded within a molding compound and wherein the fan-out structure extends over a top surface of the molding compound.

12. The device of claim 11, wherein the fan-out structure is at least partially embedded in a second molding compound, the second molding compound overlying the molding compound.

13. The device of claim 10, further comprising a first connector having a first height electrically connecting the second integrated circuit to the interposer and a second connector having a second height, less than the first height, electrically connecting the second integrated circuit to the fan-out structure.

14. The device of claim 8, wherein the interposer comprises a first redistribution layer (RDL) facing the first integrated circuit, a middle layer, and a second RDL facing the second integrated circuit, the middle layer separating the first RDL and the second RDL.

15. The device of claim 8, further comprising a third interconnect electrically connecting the interposer to the substrate.

16. A device comprising:
a substrate having a cavity in a top surface thereof;
a first integrated circuit die mounted within the cavity;
an interposer having a bottom surface mounted to the first integrated circuit die;
a second integrated circuit die mounted to a top surface of the interposer, wherein a length of the second integrated circuit die in a first direction is less than a length of the interposer in the first direction;
a fan-out structure on the top surface of the interposer, the fan-out structure extending beyond an outer periphery of the interposer;
a first conductive bump having a first height and connecting the second integrated circuit to the interposer;
a second conductive bump having a second height less than the first height and connecting the second integrated circuit to the fan-out structure;
a first interconnect having a first height and connecting the fan-out structure to the substrate; and
a second interconnect having a second height less than the first height and connecting the interposer to the substrate.

17. The device of claim 16, wherein the first interconnect and the second interconnect respectively extend through a molding compound.

18. The device of claim 16, wherein the interposer is free of through-vias.

19. The device of claim 16, wherein the interposer comprises a first redistribution layer (RDL) facing the first integrated circuit die, a middle layer, and a second RDL facing the second integrated circuit die.

20. The device of claim 16, wherein the fan-out structure is at least partially embedded in a molding compound.

* * * * *